United States Patent
Yeo

(10) Patent No.: US 11,023,651 B2
(45) Date of Patent: Jun. 1, 2021

(54) OPTICAL PROXIMITY CORRECTION (OPC) MODELING METHODS AND METHODS FOR MANUFACTURING SEMICONDUCTOR DEVICE USING THE SAME

(71) Applicant: Samsung Electronics Co., Ltd., Suwon-si (KR)

(72) Inventor: Sang Chul Yeo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 9 days.

(21) Appl. No.: 16/693,903

(22) Filed: Nov. 25, 2019

(65) Prior Publication Data
US 2020/0342071 A1 Oct. 29, 2020

(30) Foreign Application Priority Data
Apr. 25, 2019 (KR) .................. 10-2019-0048645

(51) Int. Cl.
*G06F 30/398* (2020.01)
*H01L 21/027* (2006.01)
*G03F 1/36* (2012.01)
*H01L 21/266* (2006.01)
*H01L 21/265* (2006.01)

(52) U.S. Cl.
CPC .............. *G06F 30/398* (2020.01); *G03F 1/36* (2013.01); *H01L 21/0273* (2013.01); *H01L 21/266* (2013.01); *H01L 21/26513* (2013.01)

(58) Field of Classification Search
CPC ..... G06F 30/398; G03F 1/36; H01L 21/0273; H01L 21/26513; H01L 21/266

USPC .......................................................... 438/531
See application file for complete search history.

(56) References Cited

U.S. PATENT DOCUMENTS

| | | | |
|---|---|---|---|
| 7,955,761 B2 * | 6/2011 | Yasuzato | G03F 1/29 430/5 |
| 8,423,917 B2 | 4/2013 | Song et al. | |
| 8,863,045 B1 | 10/2014 | Chen et al. | |
| 9,129,352 B2 | 9/2015 | Jeong | |
| 2019/0004418 A1 | 1/2019 | Jeong | |

FOREIGN PATENT DOCUMENTS

| | | |
|---|---|---|
| KR | 10-0688783 | 3/2007 |
| KR | 10-0875158 B1 | 12/2008 |
| KR | 10-2010-0097508 A | 9/2010 |

\* cited by examiner

*Primary Examiner* — Tu-Tu V Ho
(74) *Attorney, Agent, or Firm* — Harness, Dickey & Pierce, P.L.C.

(57) ABSTRACT

A method for manufacturing a semiconductor device includes performing an optical proximity correction (OPC) process on a designed layout based on a final model signal obtained according to an OPC modeling process to generate a corrected layout, the OPC modeling process including, selecting a transmittance value of a sub-layout pattern of a sub-layout included in a target layout, the transmittance value being a parameter of an OPC model and representing an intensity of light that transmits through a photomask, and generating a final model signal based on the transmittance value of the sub-layout pattern, and forming a photoresist pattern on a substrate using the photomask generated based on the corrected layout.

20 Claims, 33 Drawing Sheets

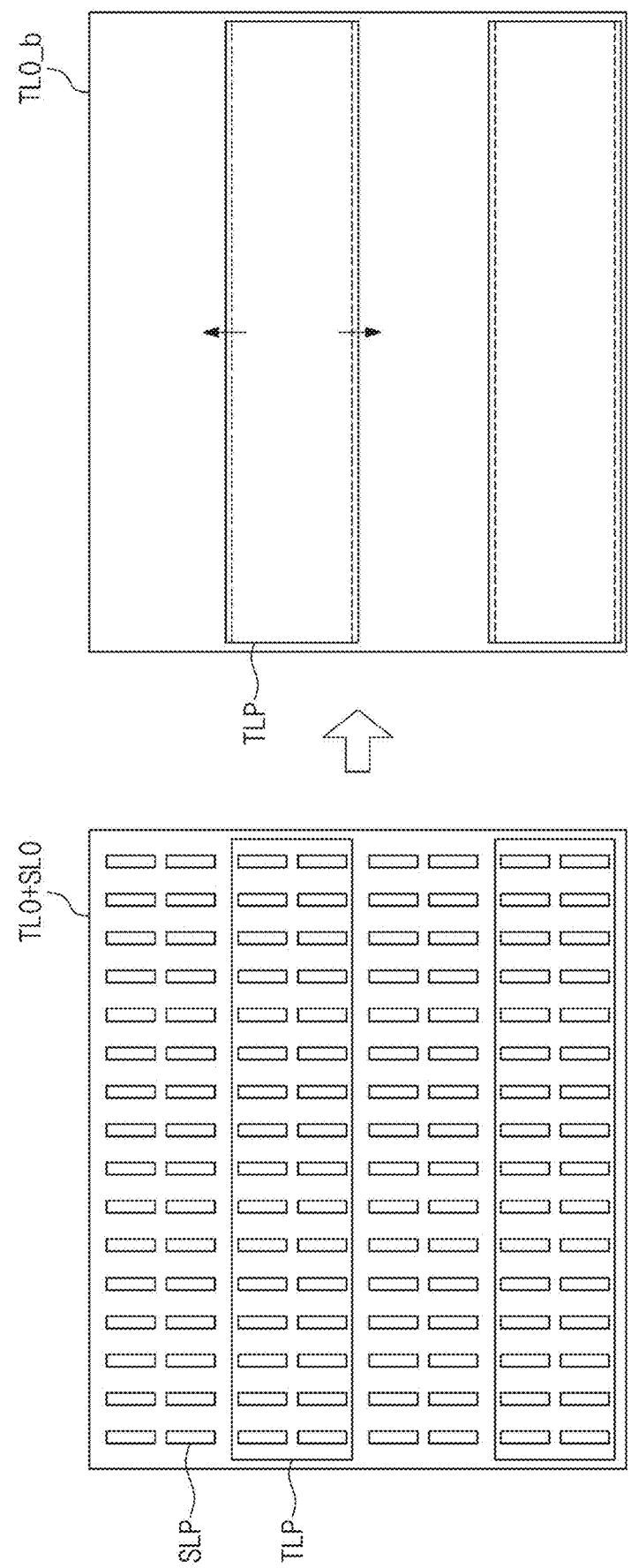

OPTICAL PROXIMITY CORRECTION (OPC) MODELING METHODS AND METHODS FOR MANUFACTURING SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2019-0048645, filed on Apr. 25, 2019, in the Korean Intellectual Property Office, the disclosure of which is hereby incorporated by reference in its entirety.

BACKGROUND

Some example embodiments relate to methods for manufacturing a semiconductor device and, more particularly, to methods for manufacturing a semiconductor device using an optical proximity correction (OPC) modeling method.

Semiconductor devices are widely used in the electronics industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices. Semiconductor devices with excellent characteristics have been increasingly demanded with the development of the electronics industry. For example, reliable, high-speed, and/or multi-functional semiconductor devices have been increasingly demanded. To satisfy these demands, semiconductor devices have been highly integrated and structures of semiconductor devices have become increasingly complicated.

SUMMARY

Some example embodiments may provide an optical proximity correction (OPC) modeling method capable of predicting a topography effect.

Some example embodiments may also provide a method for manufacturing a semiconductor device, which includes the OPC modeling method capable of predicting the topography effect.

According to some example embodiments, a method for manufacturing a semiconductor device may include performing an optical proximity correction (OPC) process on a designed layout based on a final model signal obtained according to an OPC modeling process to generate a corrected layout, the OPC modeling process including, selecting a transmittance value of a sub-layout pattern of a sub-layout included in a target layout, the transmittance value being a parameter of an OPC model and representing an intensity of light that transmits through a photomask, and generating a final model signal based on the transmittance value of the sub-layout pattern, and forming a photoresist pattern on a substrate using the photomask generated based on the corrected layout.

According to some example embodiments, a method for manufacturing a semiconductor device may include performing an optical proximity correction (OPC) process on a designed layout based on a OPC modeling process to generate a corrected layout, the OPC modeling process including, selecting a transmittance value of a sub-layout pattern to generate a final model signal, the sub-layout pattern defining a sub-layer and being included in a target layout, the target layout defining a photoresist pattern, the final model signal being generated based on a topography effect caused by a planar pattern structure, and forming the photoresist pattern on the planar pattern structure on a substrate by using a photomask generated based on the corrected layout, the planar pattern structure including a main layer and a sub-layer including a different material from that of the main layer.

According to some example embodiments, a method for manufacturing a semiconductor device may include forming a first active pattern on a first region of a substrate and a second active pattern on a second region of the substrate, forming a first source/drain region in the first active pattern and a second source/drain region in the second active pattern, forming an interlayer insulating layer on a top surface of the substrate, forming a first contact hole in the interlayer insulating layer to expose the first source/drain region, forming a second contact hole in the interlayer insulating layer to expose the second source/drain region, forming a photoresist pattern on the second region and not on the first region by performing an optical proximity correction (OPC) process on a target layout defining the photoresist pattern, the OPC process being performed based on a final model signal obtained according to an OPC modeling process, the OPC modeling process including, selecting a transmittance value of a sub-layout pattern to generate a final model signal, the sub-layout pattern defining the first contact hole and the second contact hole, the sub-layout pattern being included in the target layout, and doping the first source/drain region with dopants through the first contact hole by using the photoresist pattern as a mask.

BRIEF DESCRIPTION OF THE DRAWINGS

Some example embodiments will become more apparent in view of the attached drawings and accompanying detailed description.

FIG. 31 is a plan view illustrating a layout changed using an OPC modeling result.

DETAILED DESCRIPTION

Figure 1:
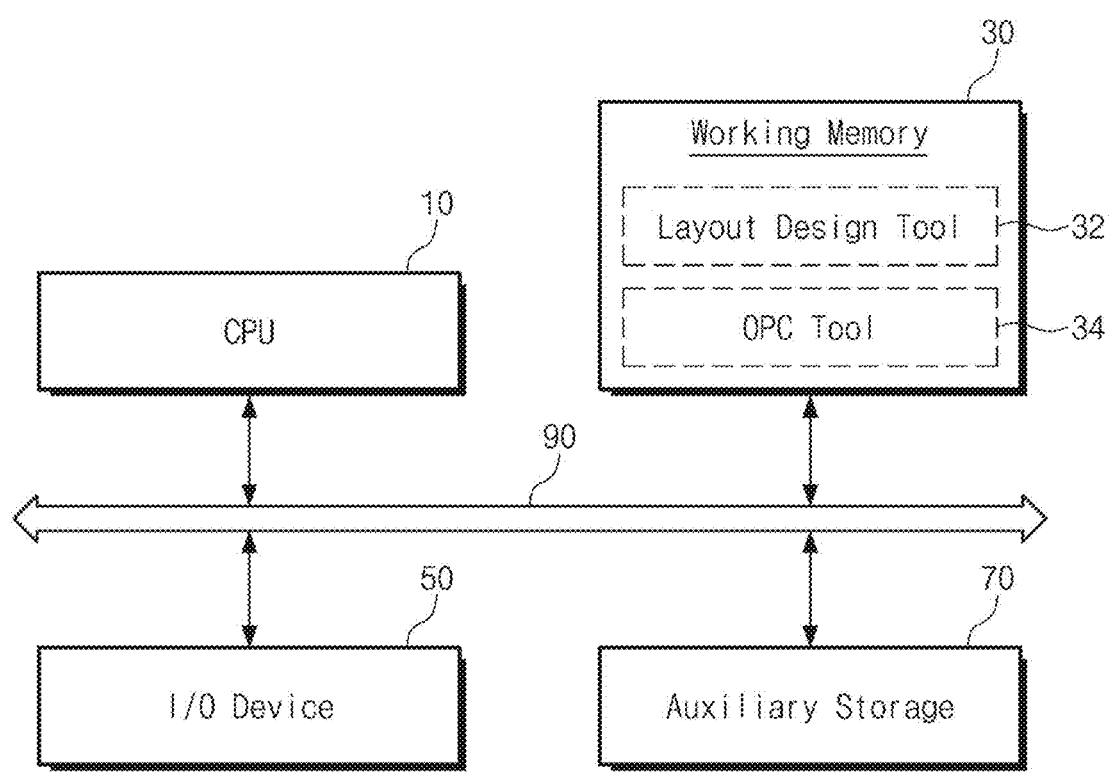
FIG. 1 is a schematic block diagram illustrating a computer system for performing a semiconductor design process, according to some example embodiments.

FIG. 1 is a schematic block diagram illustrating a computer system for performing a semiconductor design process, according to some example embodiments. Referring to FIG. 1, a computer system may include a central processing unit (CPU) 10, a working memory 30, an input/output (I/O) device 50, and/or an auxiliary storage device 70. The computer system may be a customized system for performing a layout design process according to some example embodiments. The computer system may include and execute various design and verification simulation programs.

The CPU 10 may execute a variety of software (e.g., application programs, an operating system, and/or device drivers) in the computer system. The CPU 10 may run the operating system (OS, not shown) loaded in the working memory 30. The CPU 10 may execute various application programs to be driven based on the operating system (OS). For example, the CPU 10 may execute a layout design tool 32 and/or an OPC tool 34 loaded in the working memory 30. While the computer system is described as including the CPU 10, the computer system is not limited thereto. According to some example embodiments, operations described herein as being performed by the CPU 10, the layout design tool 32 and/or the OPC tool 34 may be performed using any type of processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The operating system (OS) and/or the application programs may be loaded into the working memory 30. For example, when the computer system starts a booting operation, an OS image (not shown) stored in the auxiliary storage device 70 may be loaded into the working memory 30 on the basis of a booting sequence. Overall input/output operations of the computer system may be managed by the operating system (OS). The application programs, which may be selected by a user or be provided for basic services, may be loaded into the working memory 30. For example, the layout design tool 32 and/or the OPC tool 34 may be loaded from the auxiliary storage device 70 into the working memory 30.

The layout design tool 32 may have a bias function for changing or modifying shapes and/or positions of specific layout patterns, which are defined by a design rule. In addition, the layout design tool 32 may perform a design rule check (DRC) under a bias data condition changed or modified by the bias function. The OPC tool 34 may perform an optical proximity correction (OPC) process on layout data output from the layout design tool 32. The working memory 30 may include at least one of a volatile memory device (e.g., a static random access memory (SRAM) device and/or a dynamic random access memory (DRAM) device), and/or a non-volatile memory device (e.g., a parameter random access memory (PRAM) device, a magnetic random access memory (MRAM) device, a resistive random access memory (ReRAM) device, a ferroelectric random access memory (FRAM) device, and/or a NOR flash memory device).

The I/O device 50 may control input and/or output operations of a user through user interface devices. For example, the I/O device 50 may include a keyboard and/or a monitor and may receive relevant information from a designer. By using the I/O device 50, the designer may receive information on semiconductor regions and/or data paths for which adjusted operating characteristics should be adjusted. A process and processed results of the OPC tool 34 may be displayed through the I/O device 50.

The auxiliary storage device 70 may serve as a storage medium of the computer system. The auxiliary storage device 70 may store the application programs, the OS image, and/or various data. The auxiliary storage device 70 may be provided in the form of at least one of a memory card (e.g., MultiMediaCard (MMC), embedded multi-media controller (eMMC), secure digital (SD), and/or MicroSD) or a hard disk drive (HDD). In some example embodiments, the auxiliary storage device 70 may include a NAND-type flash memory device having a large storage capacity. Alternatively, the auxiliary storage device 70 may include at least one of next-generation non-volatile memory devices (e.g., PRAM, MRAM, ReRAM, and/or FRAM) or NOR flash memory devices.

A system interconnector 90 may serve as a system bus for providing a network in the computer system. The CPU 10, the working memory 30, the I/O device 50 and/or the auxiliary storage device 70 may be electrically connected to each other through the system interconnector 90 and/or may exchange data with each other through the system interconnector 90. However, the system interconnector 90 may not be limited to the aforementioned configuration. In some example embodiments, the system interconnector 90 may further include an additional element for increasing efficiency in data communication.

Figure 2:
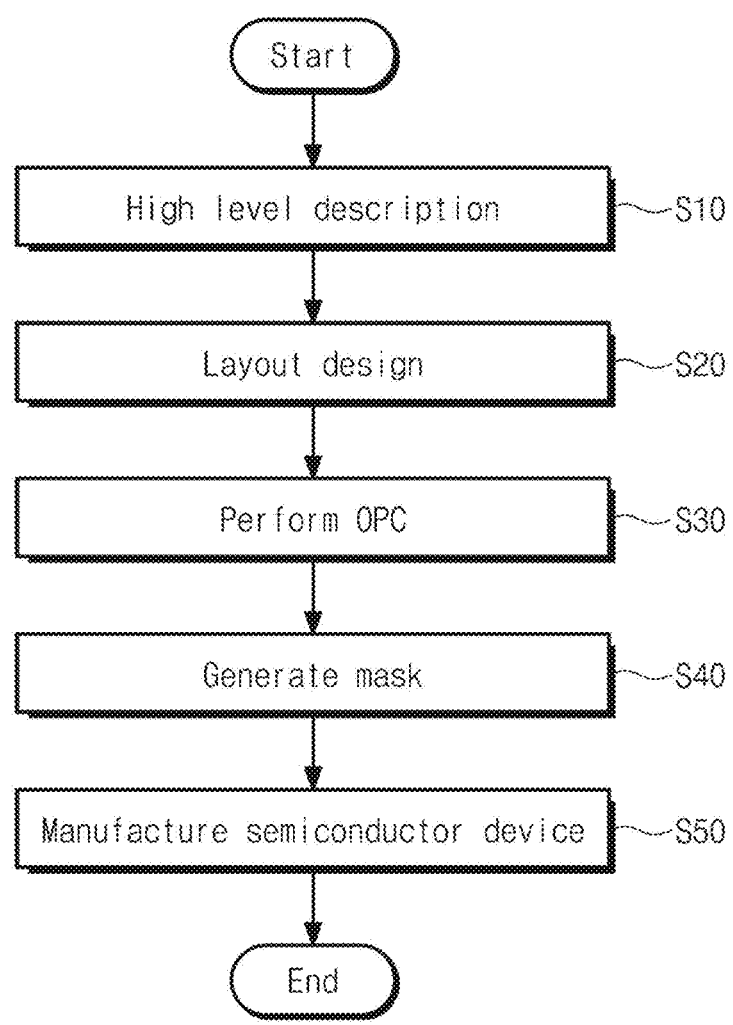
FIG. 2 is a flowchart illustrating a method for designing and manufacturing a semiconductor device, according to some example embodiments.

FIG. 2 is a flowchart illustrating a method for designing and/or manufacturing a semiconductor device, according to some example embodiments.

Referring to FIG. 2, a high-level design process of a semiconductor integrated circuit may be performed using the computer system described with reference to FIG. 1 (S10). The high-level design process may mean that an integrated circuit to be designed is described with a high-level computer language. For example, the high-level computer language may be a C language. Circuits designed by the high-level design process may be more concretely described by a register transfer level (RTL) coding and/or simulation. In addition, codes generated by the RTL coding may be converted into netlists, and the netlists may be combined with each other to realize an entire semiconductor device. The combined schematic circuit may be verified by a simulation tool. In some example embodiments, an adjusting operation may further be performed depending on results of the verification.

A layout design process may be performed to realize a logically completed semiconductor integrated circuit on a silicon substrate (S20). For example, the layout design process may be performed based on the schematic circuit prepared in the high-level design process and/or the netlist corresponding thereto. The layout design process may include processes of placing and/or routing (e.g., connecting) various standard cells that are provided from a cell library based on a predetermined or determined design rule.

The cell library for the layout design process may also include information on operations, speeds and/or power consumption of the standard cells. In some example embodiments, the cell library for representing a layout of a circuit having a specific gate level may be defined in most layout design tools. Here, the layout may define or describe shapes and/or sizes of patterns corresponding to transistors and/or metal interconnection lines which may be actually formed on a silicon substrate. For example, layout patterns (e.g., p-type metal-oxide semiconductor (PMOS), n-type metal-oxide semiconductor (NMOS), N-WELL, gate electrodes, and/or metal interconnection lines to be disposed thereon) may be suitably placed to actually form an inverter circuit on a silicon substrate. For this, first, a suitable one of inverters defined in advance in the cell library may be searched (e.g., identified via a search of the cell library and/or selected.

In addition, the routing process may be performed on the selected and placed standard cells. In detail, the routing process may be performed on the selected and placed standard cells to connect them to upper interconnection lines. By the routing process, the standard cells may be electrically connected to each other to meet a design. These processes may be automatically and/or manually performed by the layout design tool. In some example embodiments, the processes of placing and/or routing the standard cells may be automatically performed by an additional place & routing tool.

After the routing process, a verification process may be performed on the layout to verify whether there is a portion violating the design rule. In some example embodiments, the verification process may include various verification items, such as a design rule check (DRC) item, an electrical rule check (ERC) item, and/or a layout vs schematic (LVS) item. The DRC item may be performed to check whether the layout suitably meets the design rule. The ERC item may be performed to check whether there is an issue of electrical disconnection in the layout. The LVS item may be performed to check whether the layout is prepared to coincide with the gate-level netlist.

An optical proximity correction (OPC) process may be performed (S30). The layout patterns obtained by the layout design process may be realized on a silicon substrate by using a photolithography process. The OPC process may be performed to correct an optical proximity effect which may occur in (e.g., as a result of) the photolithography process. The optical proximity effect may be an unintended optical effect (such as refraction and/or diffraction) which may occur in the photolithography process. In other words, a distortion phenomenon of layout patterns, which may be caused by the optical proximity effect, may be corrected by the OPC process. Shapes and/or positions of patterns in the designed layout may be changed and/or biased by the OPC process. The optical proximity correction (OPC) process will be described later in more detail with reference to FIGS. 3 to 8.

A photomask may be generated based on the layout changed and/or biased by the OPC process (S40). In general, the photomask may be generated by patterning a chromium layer, deposited on a glass substrate, by using data of the changed and/or biased layout.

A semiconductor device may be manufactured using the generated photomask (S50). Various exposure and/or etching processes may be repeated in the manufacture of the semiconductor device using the photomasks. By these processes, shapes of patterns obtained in the layout design process may be sequentially formed on a silicon substrate.

Figure 3:
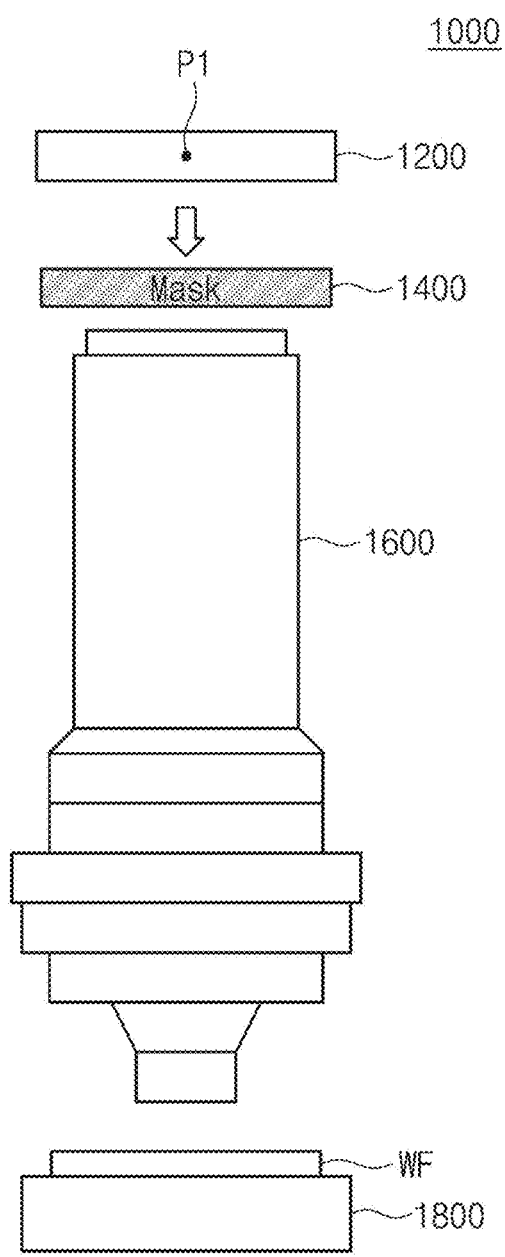
FIG. 3 is a conceptual view illustrating a photolithography system using a photomask manufactured according to some example embodiments.

FIG. 3 is a conceptual view illustrating a photolithography system using a photomask manufactured according to some example embodiments. A photolithography system 1000 may include a light source 1200, a photomask 1400, a reduction projection unit 1600, and/or a substrate stage 1800. However, the photolithography system 1000 may further include components not shown in FIG. 3. For example, the photolithography system 1000 may further include a sensor used to measure a height and/or a gradient of a surface of a substrate WF.

The light source 1200 may emit light. The light emitted from the light source 1200 may be irradiated and/or provided to the photomask 1400. In some example embodiments, a lens may be provided between the light source 1200 and the photomask 1400 to adjust a focus of the light. The light source 1200 may include an ultraviolet light source (e.g., a krypton fluoride (KrF) light source having a wavelength of 234 nm and/or an argon fluoride (ArF) light source having a wavelength of 193 nm). The light source 1200 may include a single point light source P1. However, some example embodiments are not limited thereto. In some example embodiments, the light source 1200 may include a plurality of point light sources.

To realize the designed layout, for example, by printing the designed layout onto the substrate WF, the photomask 1400 may include image patterns. The image patterns may be formed based on the layout patterns obtained through the layout design process and/or the OPC process described above. The image patterns may be defined by a transparent region and an opaque region. The transparent region may be formed by etching a metal layer (e.g., a chromium layer) on the photomask 1400. The transparent region may transmit the light emitted from the light source 1200. The opaque region may not transmit light but may block light. According to some example embodiments, the opaque region may transmit less light than the transparent region.

The reduction projection unit 1600 may receive the light transmitted through the transparent region of the photomask 1400. The reduction projection unit 1600 may match patterns, to be printed onto the substrate WF, with the image patterns of the photomask 1400. The light may be irradiated to the substrate WF through the reduction projection unit 1600. Thus, patterns corresponding to the image patterns of the photomask 1400 may be printed onto the substrate WF.

The substrate stage 1800 may support the substrate WF. For example, the substrate WF may include a silicon wafer. The reduction projection unit 1600 may include an aperture. The aperture may be used to increase a depth of a focus of ultraviolet light emitted from the light source 1200. For example, the aperture may include a dipole aperture and/or a quadruple aperture. The reduction projection unit 1600 may further include a lens for adjusting a focus of light.

As an integration density of a semiconductor device increases, a distance between the image patterns of the photomask 1400 may decrease. Interference and/or diffraction of light may occur due to this proximity, and thus a distorted pattern may be printed on the substrate WF. If the distorted pattern is printed on the substrate WF, a designed circuit may operate abnormally.

A resolution enhancement technology may be used to prevent or reduce the distortion of the pattern. The optical proximity correction (OPC) process (see S30 of FIG. 2) is an example of the resolution enhancement technology. According to the optical proximity correction (OPC) process, a degree of the distortion such as the interference and/or diffraction of light may be predicted (e.g., estimated) by a simulation of an OPC model. The designed layout may be changed (or biased) based on the predicted results. Image patterns may be formed on the photomask 1400 on the basis of the changed layout, and thus desired patterns may be printed on the substrate WF.

A layout of a semiconductor device may include a plurality of layers. In some example embodiments, the optical proximity correction (OPC) process may be performed to adjust or correct a single layer of the layout. In other words, the optical proximity correction (OPC) process may be independently performed on each of the plurality of layers. The plurality of layers may be sequentially realized on a substrate through semiconductor processes to manufacture a semiconductor device. In some example embodiments, a semiconductor device may include a plurality of stacked metal layers to realize (e.g., form and/or manufacture) a specific circuit.

Figure 4:
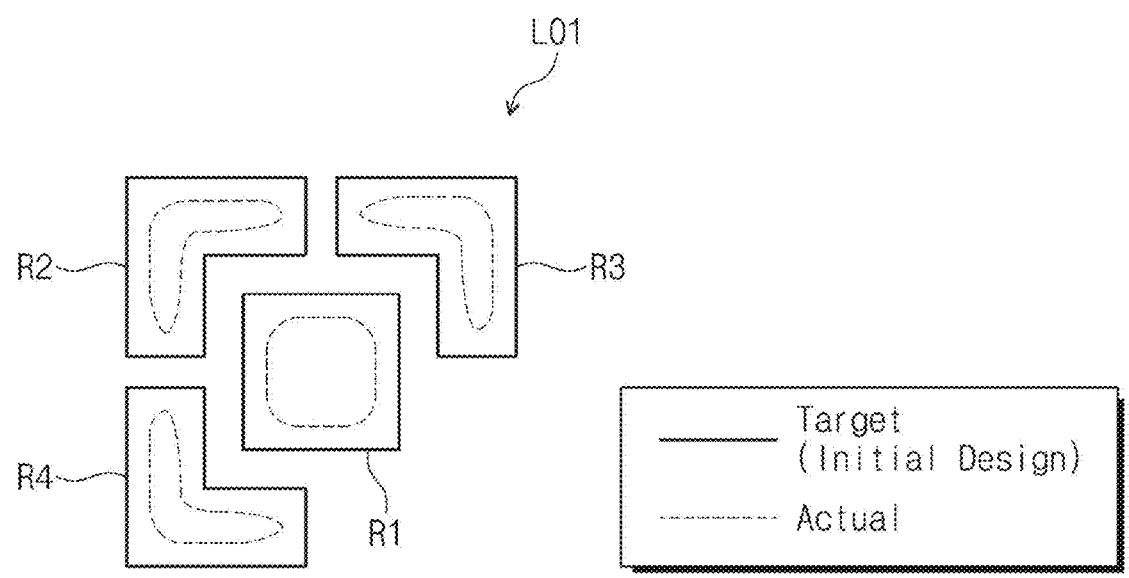
FIG. 4 is a conceptual diagram illustrating a layout according to some example embodiments.

FIG. 4 is a conceptual diagram illustrating a layout according to some example embodiments. Solid lines of FIG. 4 show target patterns to be printed on the substrate WF of FIG. 3. Dotted lines of FIG. 4 show actual patterns actually printed on the substrate WF of FIG. 3.

A designed layout LO1 may include first, second, third and fourth circuit patterns R1, R2, R3 and R4. A shape of the designed layout LO1 of FIG. 4 is illustrated as an example. However, some example embodiments are not limited thereto. The designed layout LO1 may be provided as an initial design layout. The solid lines of the first to fourth circuit patterns R1 to R4 illustrated in FIG. 4 may represent the target patterns to be realized on the substrate WF. According to some example embodiments, the target patterns (e.g., target layout patterns and/or photoresist patterns) may correspond to a designed layout generated by the layout design tool 32.

As described above, the distortion such as the interference and/or the diffraction of light may occur when a pattern is realized (e.g., printed) on the substrate WF. If the image patterns of the photomask 1400 are formed based on the solid lines of FIG. 4, the first to fourth circuit patterns R1 to R4 may be realized on the substrate SW in the form of patterns shown by the dotted lines of FIG. 4. If distorted patterns shown by the dotted lines of FIG. 4 are printed on the substrate WF, a designed circuit may operate abnormally.

The optical proximity correction (OPC) process may be performed to prevent or reduce the distortion of the pattern (e.g., the target patterns). The designed layout LO1 may be changed (or biased) through the OPC process to reduce an error between the actual pattern (the dotted line of FIG. 4) and the target pattern (the solid line of FIG. 4). The image patterns of the photomask 1400 may be formed based on the biased layout. When a photolithography process is performed using this photomask 1400, actual patterns having substantially the same shape as the first to fourth circuit patterns R1 to R4 of the designed layout LO1 may be printed on the substrate WF.

Figure 5:
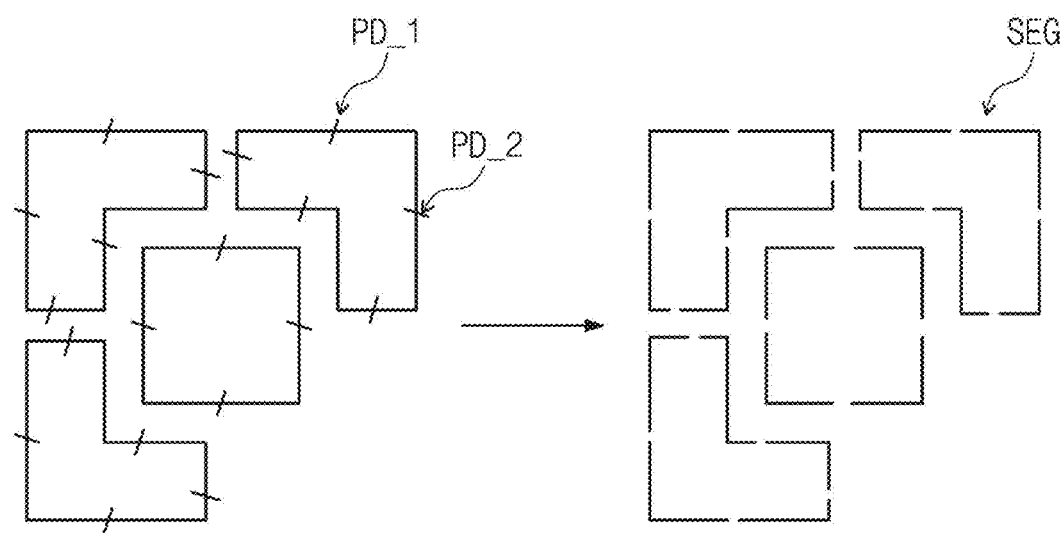
FIG. 5 is a conceptual diagram illustrating a process of dividing a contour of the designed layout of FIG. 4 into a plurality of segments in an optical proximity correction process.

FIG. 5 is a conceptual diagram illustrating a process of dividing a contour of the designed layout of FIG. 4 into a plurality of segments in an optical proximity correction process. Referring to FIG. 5, a plurality of division points may be set on a contour of the designed layout. For example, a first division point PD_1 and a second division point PD_2 may be set on the contour of the designed layout. One segment SEG may be obtained based on the first division point PD_1 and the second division point PD_2. Likewise, the contour of the designed layout may be divided into a plurality of segments SEG, based on the plurality of division points.

The term 'division' used herein may not mean physical division. In FIG. 5, the plurality of segments SEG are physically divided. However, this is conceptually provided for understanding of some example embodiments.

Figure 6:
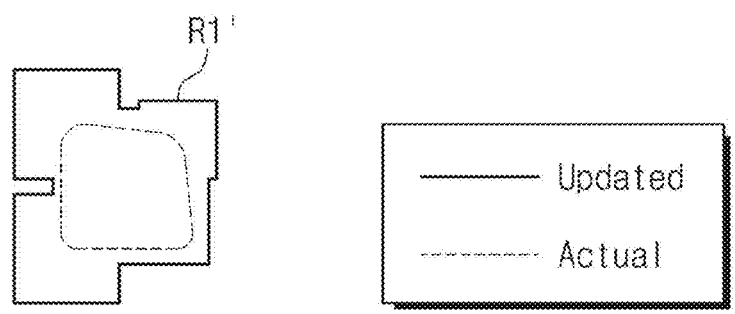
FIG. 6 is a conceptual diagram illustrating a layout corrected by the optical proximity correction process of FIG. 5.

In the optical proximity correction process, each of the divided segments SEG may be a target to be biased. The divided segments SEG may be biased independently of each other. For example, one segment SEG may be biased in a first direction (e.g., a positive direction or an outward direction) or a second direction (e.g., a negative direction or an inward direction), independently of other segments SEG. Each of the divided segments SEG may be biased to reduce an error between the target pattern and the actual pattern realized on the substrate WF. The divided segments SEG may be biased by the OPC tool 34 of FIG. 1. An example of a corrected layout obtained based on the biased segments is illustrated in FIG. 6. According to some example embodiments, the biasing of divided segments SEG may be performed according to methods and/or implementations known to a person having ordinary skill in the art. According to some example embodiments, the OPC process may be performed according to methods and/or implementations known to a person having ordinary skill in the art. According to some example embodiments, the OPC process may be performed using processing circuitry, such as the CPU 10.

FIG. 6 is a conceptual diagram illustrating a layout corrected by the optical proximity correction process of FIG. 5. Referring to FIG. 6, a first correction pattern R1' corrected from the first circuit pattern R1 of FIG. 4 may be provided.

Descriptions to the second to fourth circuit patterns R2 to R4 of FIG. 4 will be omitted for the purpose of ease and convenience in explanation. As described above with reference to FIG. 5, the contour of the first circuit pattern R1 of FIG. 4 may be divided into several segments, and each of the divided segments may be biased. As illustrated in FIG. 6, each of the segments may be biased in the first direction (e.g., the positive direction or the outward direction) or the second direction (e.g., the negative direction or the inward direction). Here, a certain segment may not be biased. Thus, the first correction pattern R1' may be obtained.

A dotted line of FIG. 6 shows an actual pattern that will be actually printed using the corrected layout on the substrate WF of FIG. 3. Since at least one or each of the divided segments is biased, the error between the actual pattern and the target pattern may be reduced.

Figure 7:
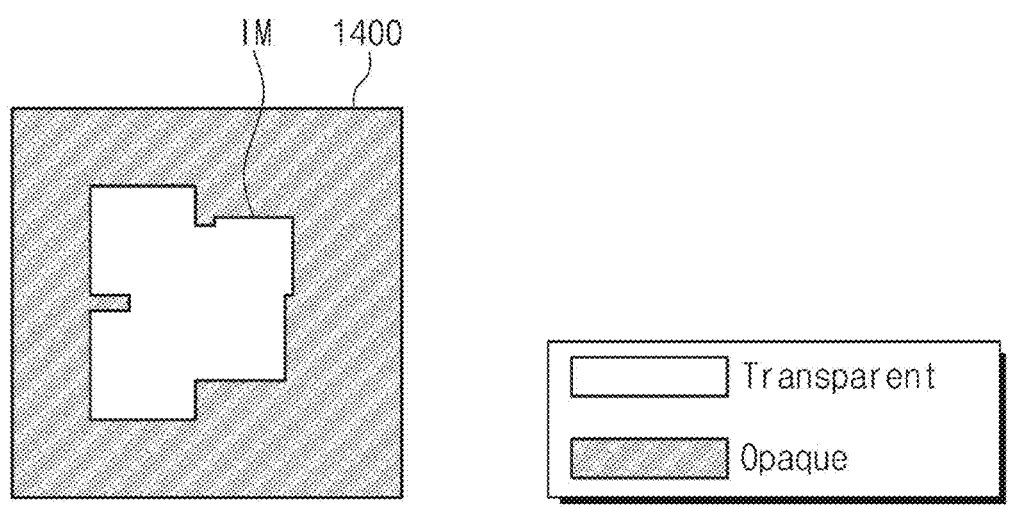
FIG. 7 is a conceptual view illustrating a photomask manufactured based on the corrected layout of FIG. 6.

FIG. 7 is a conceptual view illustrating a photomask manufactured based on the corrected layout of FIG. 6. In some example embodiments, as illustrated in FIG. 7, the photomask 1400 may include an image pattern IM corresponding to the first correction pattern R1' of FIG. 6. The photomask 1400 may include a transparent region and an opaque region. The opaque region may not transmit light but may block light. The transparent region may transmit light emitted from the light source 1200 of FIG. 3. Light transmitted through the photomask 1400 may be irradiated to a top surface of the substrate WF of FIG. 3. For example, when a photolithography process uses a negative photoresist, the image pattern IM may be the transparent region of the photomask 1400.

Figure 8:
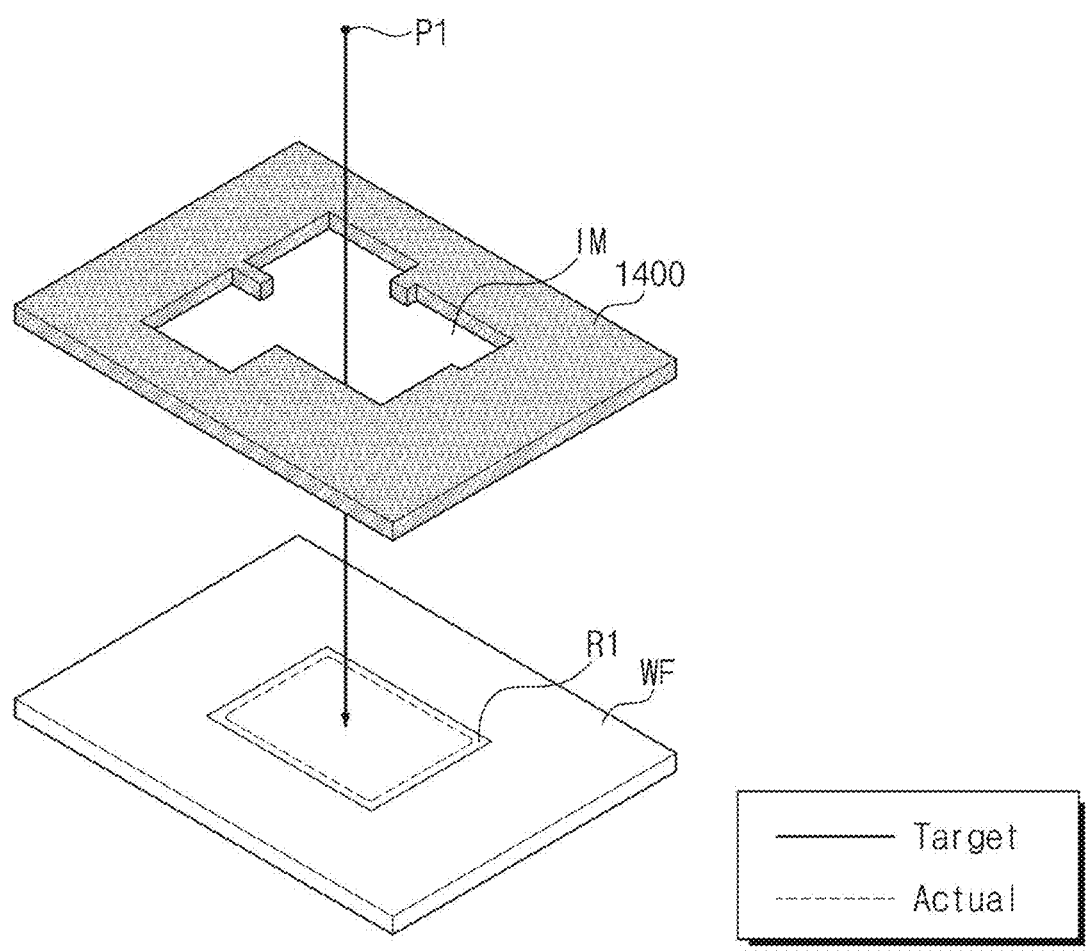
FIG. 8 is a conceptual view illustrating a process of printing a circuit pattern on a substrate by using the photomask of FIG. 7.

FIG. 8 is a conceptual view illustrating a process of printing a circuit pattern on a substrate by using the photomask of FIG. 7. The point light source P1 of the light source 1200 of FIG. 3 may emit light to the photomask 1400. The emitted light may pass through the transparent region of the image pattern IM and then may be irradiated to the negative photoresist on the substrate WF (also referred to as an exposure process). A region of the negative photoresist to which the light is irradiated may remain but another region of the negative photoresist to which the light is not irradiated may be removed (also referred to as a development process). Thus, a first circuit pattern R1 corresponding to the image pattern IM may be printed on the substrate WF.

An actual pattern shown by a dotted line may be printed on the substrate SW. The actual pattern may have substantially the same shape and/or size as a target pattern shown by a solid line. As a result, the error between the actual pattern and the target pattern may be minimized or reduced by the optical proximity correction (OPC) process.

Figure 9:
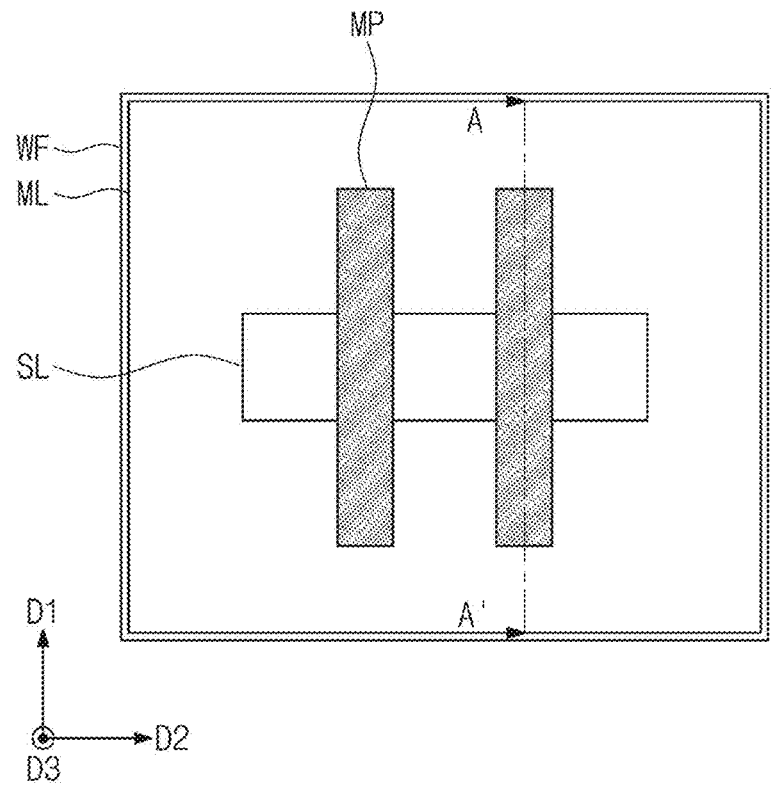
FIG. 9 is a plan view illustrating a planar pattern structure and a photoresist pattern on a substrate.
Figure 10:
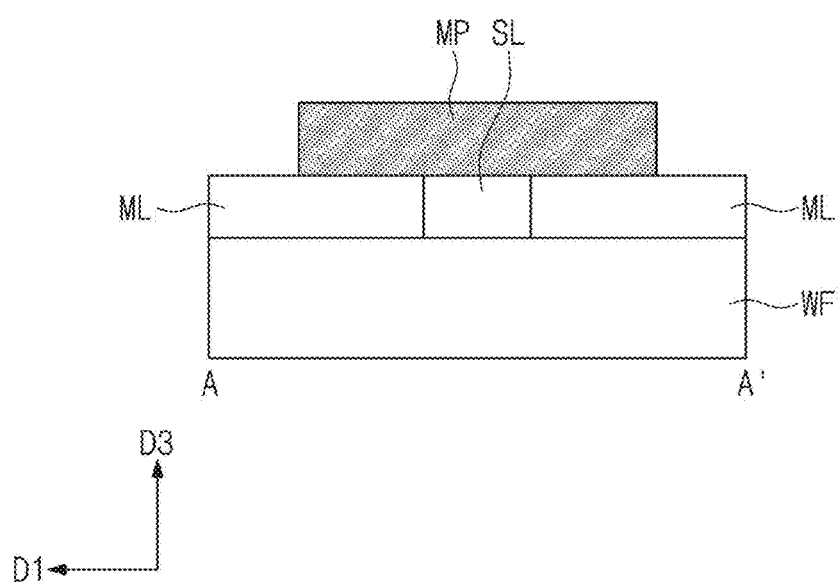
FIG. 10 is a cross-sectional view taken along a line A-A' of FIG. 9.

FIG. 9 is a plan view illustrating a planar pattern structure and a photoresist pattern on a substrate. FIG. 10 is a cross-sectional view taken along a line A-A' of FIG. 9.

Referring to FIGS. 9 and 10, a planar pattern structure ML and SL may be formed on a substrate WF. The substrate WF may be a semiconductor wafer (e.g., a silicon wafer). In some example embodiments, one or more additional layers may be disposed between the substrate WF and the planar pattern structure ML and SL. Some example embodiments are not limited to the planar pattern structure ML and SL of FIG. 10. According to some example embodiments, the main layer ML may be a silicon oxide layer and the sub-layer may be an air layer.

The planar pattern structure ML and SL may include a main layer ML and a sub-layer SL. The sub-layer SL may have a bar shape extending in a second direction D2. The main layer ML may surround the sub-layer SL when viewed in a plan view. A top surface of the main layer ML and a top surface of the sub-layer SL may be coplanar or substantially coplanar with each other. An area of the main layer ML may be greater than an area of the sub-layer SL (e.g., when viewed in a plan view).

The main layer ML and the sub-layer SL may include different materials. In other words, optical properties of the main layer ML may be different from optical properties of the sub-layer SL. The planar pattern structure ML and SL including one main layer ML and one sub-layer SL is illustrated as an example in FIG. 9. However, some example embodiments are not limited thereto. In some example embodiments, a plurality of the sub-layers SL may be provided in the main layer ML, and the plurality of sub-layers SL may include the same material, substantially the same materials or different materials.

Photoresist patterns MP may be formed on the planar pattern structure ML and SL. Each of the photoresist patterns MP may have a bar shape extending in a first direction D1. Each of the photoresist patterns MP may cross over the sub-layer SL and may extend in the first direction D1.

The planar pattern structure ML and SL formed under the photoresist patterns MP may affect the photoresist patterns MP when the photoresist patterns MP are formed by the photolithography process described above. This influence or affection may be referred to as a topography effect. In the formation of the photoresist patterns MP, shapes of the photoresist patterns MP may be deformed based on shapes and/or properties of the planar pattern structure ML and SL under the photoresist patterns MP.

For example, since the optical properties of the main layer ML are different from the optical properties of the sub-layer SL, the behavior of light irradiated onto the main layer ML may be different from the behavior of light irradiated onto the sub-layer SL in the photolithography process. Thus, a shape of the photoresist pattern MP developed (or formed) on the main layer ML may be different from a shape of the photoresist pattern MP developed (or formed) on the sub-layer SL.

An OPC modeling method capable of predicting the topography effect caused by the planar pattern structure ML and SL and a method for performing an OPC process using the same will be described hereinafter.

Figure 11:
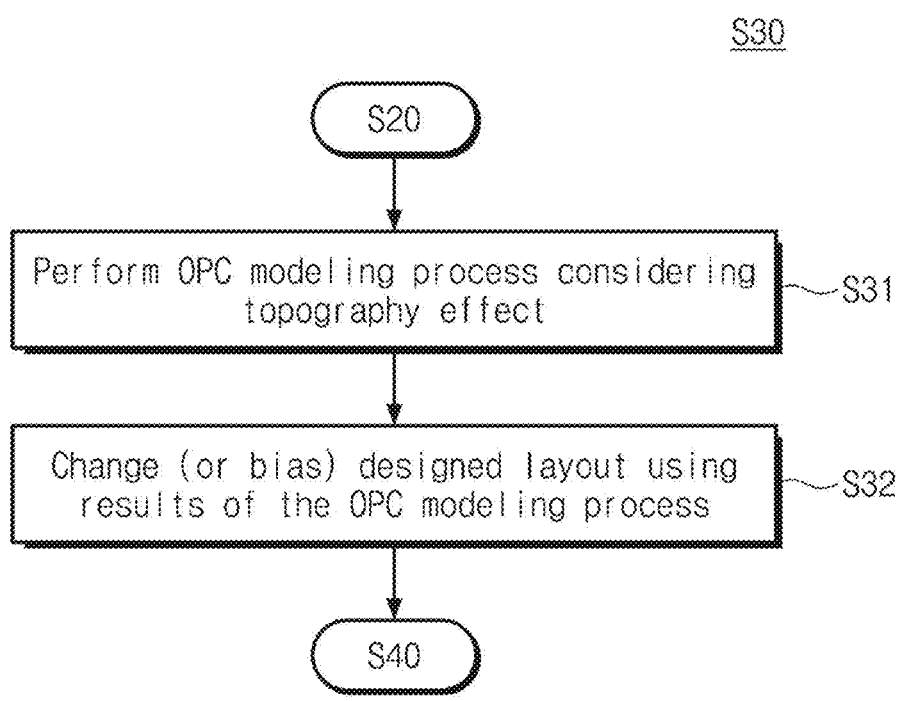
FIG. 11 is a flowchart illustrating an optical proximity correction method according to some example embodiments.
Figure 12:
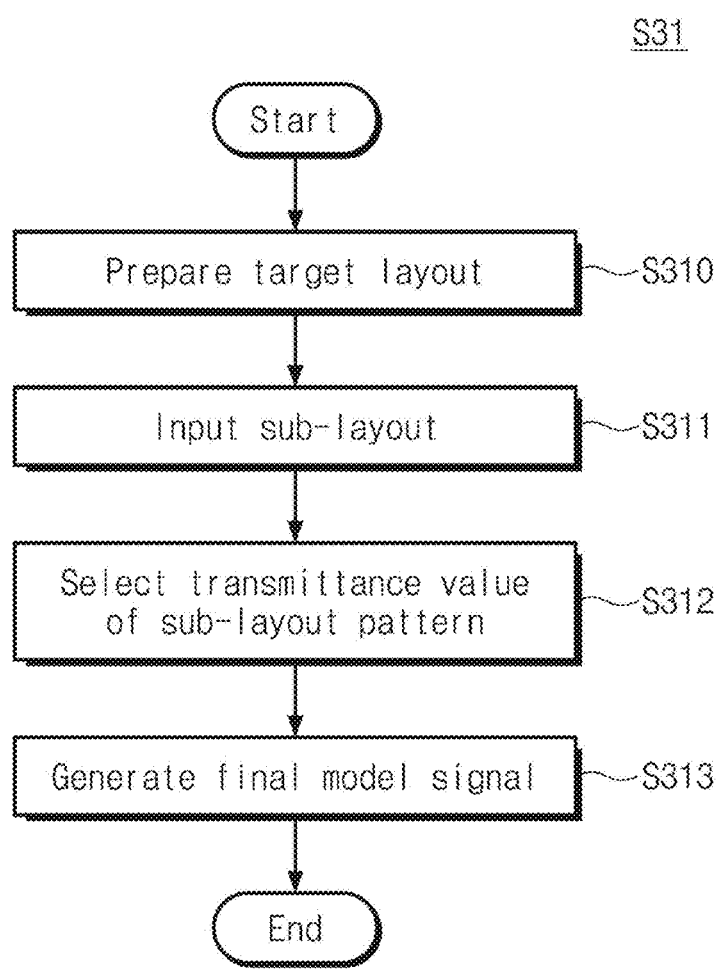
FIG. 12 is a flowchart illustrating an OPC modeling method of FIG. 11.

FIG. 11 is a flowchart illustrating an optical proximity correction method according to some example embodiments. FIG. 12 is a flowchart illustrating an OPC modeling method of FIG. 11.

Referring to FIG. 11, the performing of the OPC process on the designed layout (S30) may include performing (e.g., by processing circuitry, such as the CPU 10) an OPC modeling process with consideration of the topography effect (S31), and changing (or biasing) (e.g., by processing circuitry, such as the CPU 10) the designed layout (e.g., the result of operation S20 of FIG. 2) using results of the OPC modeling process (S32).

In detail, parameters of an OPC model may be appropriately set through the OPC modeling process. A pattern to be actually formed may be predicted from the designed layout by a simulation using the OPC model. The designed layout may be changed (or biased) based on the predicted results. The operations of FIG. 11 may be performed by the OPC tool 34 of FIG. 1. According to some example embodiments, the OPC model may be generated based on empirical study (e.g., with respect to the effects of different transmittance values on topography effects). According to some example embodiments, the OPC model may be obtained using methods and/or implementations known to a person of ordinary skilled in the art, and modified (e.g., to reflect the effects of different transmittance values on topography effects). According to some example embodiments, the OPC model may include a database in which different transmittance values are stored in association with respective changes or biases to a designed layout and/or segment.

Figure 13:
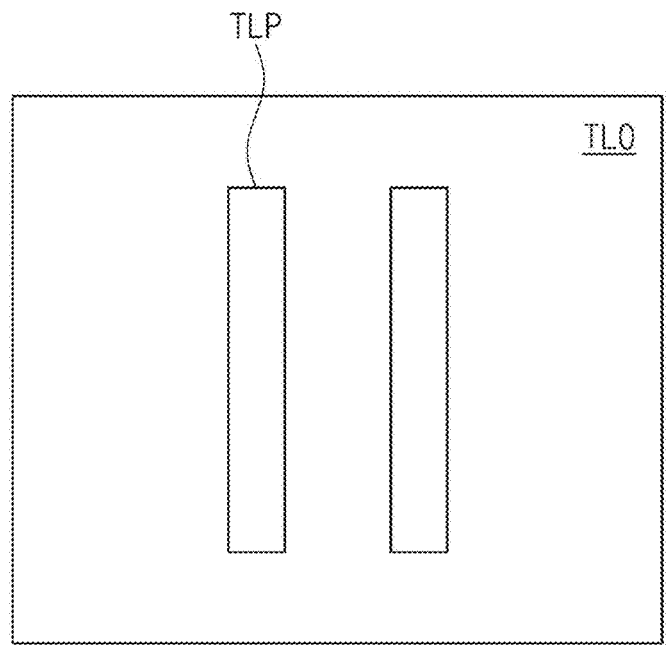
FIG. 13 is a plan view illustrating a target layout according to some example embodiments.
Figure 14:
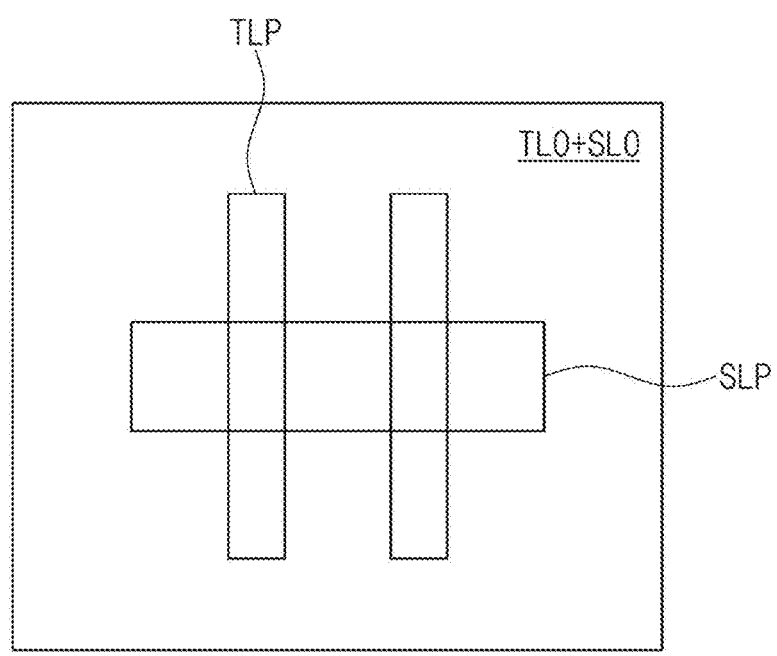
FIG. 14 is a plan view illustrating an operation of inputting a sub-layout into the target layout of FIG. 13.
Figure 15:
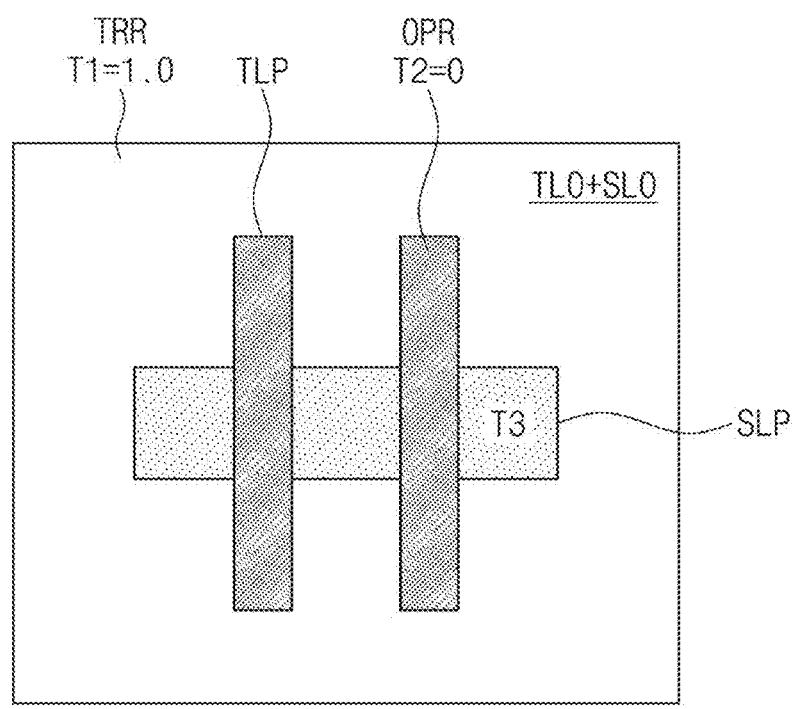
FIG. 15 is a plan view illustrating an operation of setting transmittance values in a layout of FIG. 14.
Figure 16A:
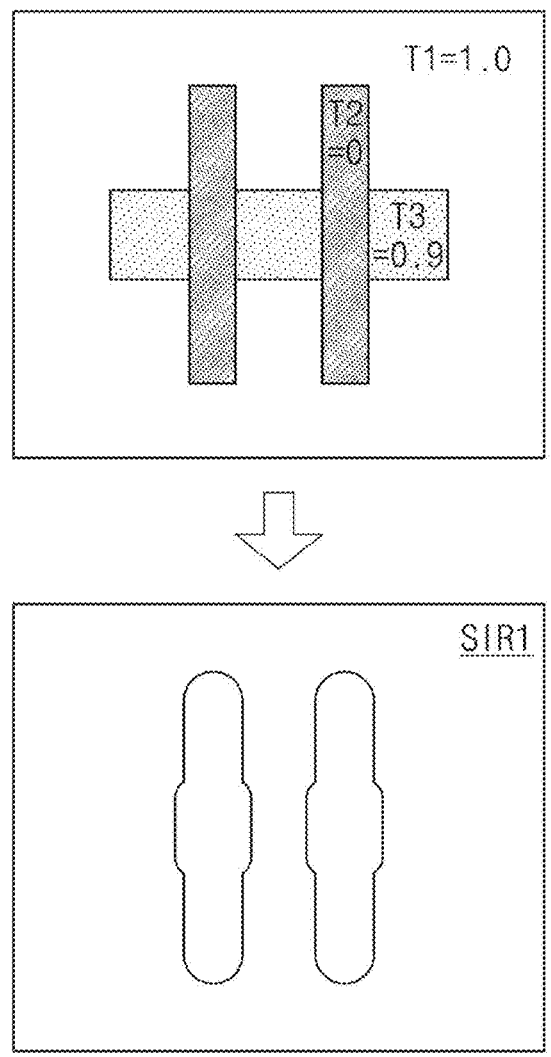
FIG. 16A is a plan view illustrating a first simulation result of a layout of FIG. 15.
Figure 16B:
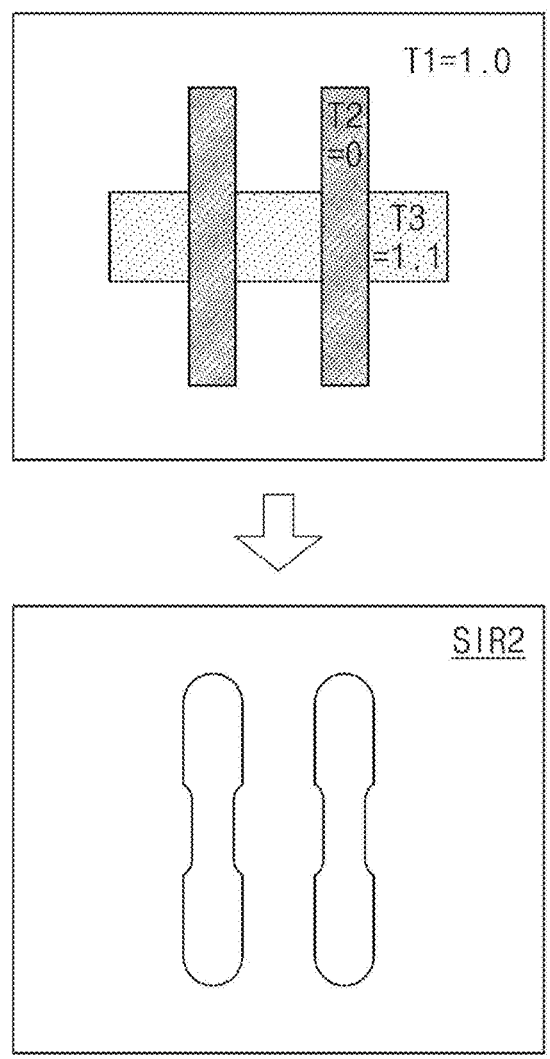
FIG. 16B is a plan view illustrating a second simulation result of the layout of FIG. 15.
Figure 17:
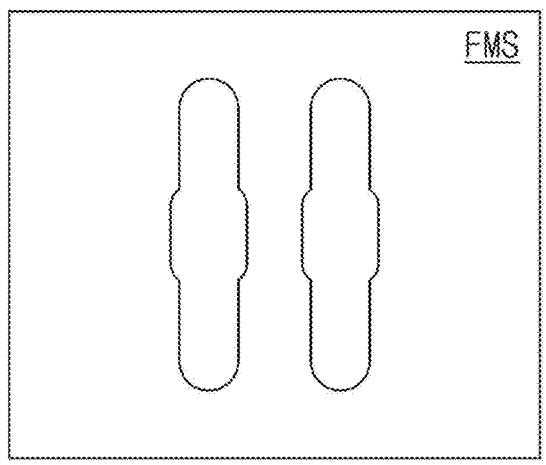
FIG. 17 is a plan view illustrating a final model signal according to some example embodiments.

The OPC modeling method (S31) will be described in more detail with reference to FIG. 12. FIG. 13 is a plan view illustrating a target layout according to some example embodiments. FIG. 14 is a plan view illustrating an operation of inputting a sub-layout into the target layout of FIG. 13. FIG. 15 is a plan view illustrating an operation of setting transmittance values in a layout of FIG. 14. FIG. 16A is a plan view illustrating a first simulation result of a layout of FIG. 15. FIG. 16B is a plan view illustrating a second simulation result of the layout of FIG. 15. FIG. 17 is a plan view illustrating a final model signal according to some example embodiments.

Referring to FIGS. 12 and 13, a target layout TLO including target layout patterns TLP may be prepared (e.g., by processing circuitry, such as the CPU 10) (S310). The target layout TLO of FIG. 13 is a layout of the photoresist patterns MP described above with reference to FIGS. 9 and 10. According to some example embodiments, the target layout patterns may correspond to a designed layout generated by the layout design tool 32.

The target layout patterns TLP may have bar shapes. The target layout patterns TLP may correspond to the photoresist patterns MP described above with reference to FIGS. 9 and 10.

Referring to FIGS. 12 and 14, a sub-layout SLO may be input into and/or combined with the target layout TLO (e.g., by processing circuitry, such as the CPU 10) (S311). The sub-layout SLO is a layout of the sub-layer SL described above with reference to FIGS. 9 and 10. The sub-layout SLO may include a sub-layout pattern SLP. The sub-layout pattern SLP may correspond to the sub-layer SL described above with reference to FIGS. 9 and 10.

Hereinafter, a case in which a photolithography process according to some example embodiments uses a positive photoresist will be described as an example.

Referring to FIGS. 12 and 15, transmittance values of the layout TLO+SLO may be set (e.g., by processing circuitry, such as the CPU 10). The transmittance may mean a transparent degree (or degree of transparency) of a photomask, e.g., the intensity of light transmitted through (or transmittable through, or expected to transmit through, that transmits through, etc.) the photomask. The transmittance value may be a parameter of the OPC model, which is obtained by quantifying the transmittance of the photomask (e.g., a reference photomask, or expected transmittance values of the photomask). In other words, the transmittance value may be a parameter of the OPC model, which is obtained by quantifying the intensity of the light transmitted through the photomask. A transmittance value of the transparent region of the photomask may be set to 1.0 (e.g., the intensity of light transmitted through the transparent region is 1.0), and a transmittance value of the opaque region of the photomask may be set to 0 (e.g., the intensity of light transmitted through the opaque region is 0).

The target layout TLO may include a transparent region TRR and an opaque region OPR. The target layout patterns TLP defining the photoresist patterns MP may be the opaque regions OPR. A remaining region of the target layout TLO except the target layout patterns TLP may be the transparent region TRR.

The transparent region TRR may have a first transmittance value T1, and the first transmittance value T1 may be set to 1.0. The opaque region OPR may have a second transmittance value T2, and the second transmittance value T2 may be set to 0.

A transmittance value of the sub-layout pattern SLP may be selected (e.g., by processing circuitry, such as the CPU 10) (S312). In detail, the sub-layout pattern SLP of the sub-layout SLO may have a third transmittance value T3. A region of the sub-layout pattern SLP, which overlaps with the transparent region TRR, may have the third transmittance value T3. Other regions of the sub-layout pattern SLP, which overlap with the opaque regions OPR, may be excluded from consideration. In other words, the other regions of the sub-layout pattern SLP, which overlap with the opaque regions OPR, may have the second transmittance value T2.

The third transmittance value T3 may be selected to be greater or less than 1.0. For example, the third transmittance value T3 may be selected in a range of 0.1 to 2.0. Hereinafter, a method of selecting the third transmittance value T3 will be described as an example.

Referring to FIG. 16A, the third transmittance value T3 may be set to 0.9 slightly less than 1.0. The OPC model may recognize that the intensity of light transmitted through the sub-layout pattern SLP is 90% of the intensity of light transmitted through the transparent region TRR. The OPC model may simulate (e.g., processing circuitry, such as the CPU 10, may simulate using the OPC model) a shape of a pattern to be formed on a substrate, based on the layout and the transmittance values shown in FIG. 16A. An example image of the result is shown as a first simulation result SIR1.

Referring to FIG. 16B, the third transmittance value T3 may be set to 1.1 slightly greater than 1.0. The OPC model may recognize that the intensity of light transmitted through the sub-layout pattern SLP is 110% of the intensity of light transmitted through the transparent region TRR. The OPC model may simulate (e.g., processing circuitry, such as the CPU 10, may simulate using the OPC model) a shape of a pattern to be formed on a substrate, based on the layout and the transmittance values shown in FIG. 16B. An example image of the result is shown as a second simulation result SIR2.

Since it is assumed that a relatively small amount of light is incident onto the sub-layer in the OPC model of FIG. 16A, it is predicted (e.g., estimated) that a width of a pattern on the sub-layer is increased in the first simulation result SIR1. Since it is assumed that a relatively large amount of light is incident onto the sub-layer in the OPC model of FIG. 16B, it is predicted that a width of a pattern on the sub-layer is reduced in the second simulation result SIR2.

A more appropriate result may be selected by comparing (e.g., by processing circuitry, such as the CPU 10) the first and second simulation results SIR1 and SIR2 with each other. For example, when the first simulation result SIR1 of FIG. 16A is determined as an appropriate result, the third transmittance value T3 of the sub-layout pattern SLP may be selected as 0.9. The first transmittance value (T1=1.0), the second transmittance value (T2=0) and the third transmittance value (T3=0.9) may be set as transmittance parameters of the OPC model.

Referring to FIGS. 12 and 17, a final model signal FMS may be generated (e.g., by processing circuitry, such as the CPU 10) using the OPC model in which the transmittance parameters are set (S313). According to some example embodiments, the final model signal FMS includes an indication of an expected photoresist pattern determined based on one or more simulations performed using the OPC model, which is based on the combined target layout TLO and sub-layer layout SLO and selected third transmittance value T3.

Figure 18:
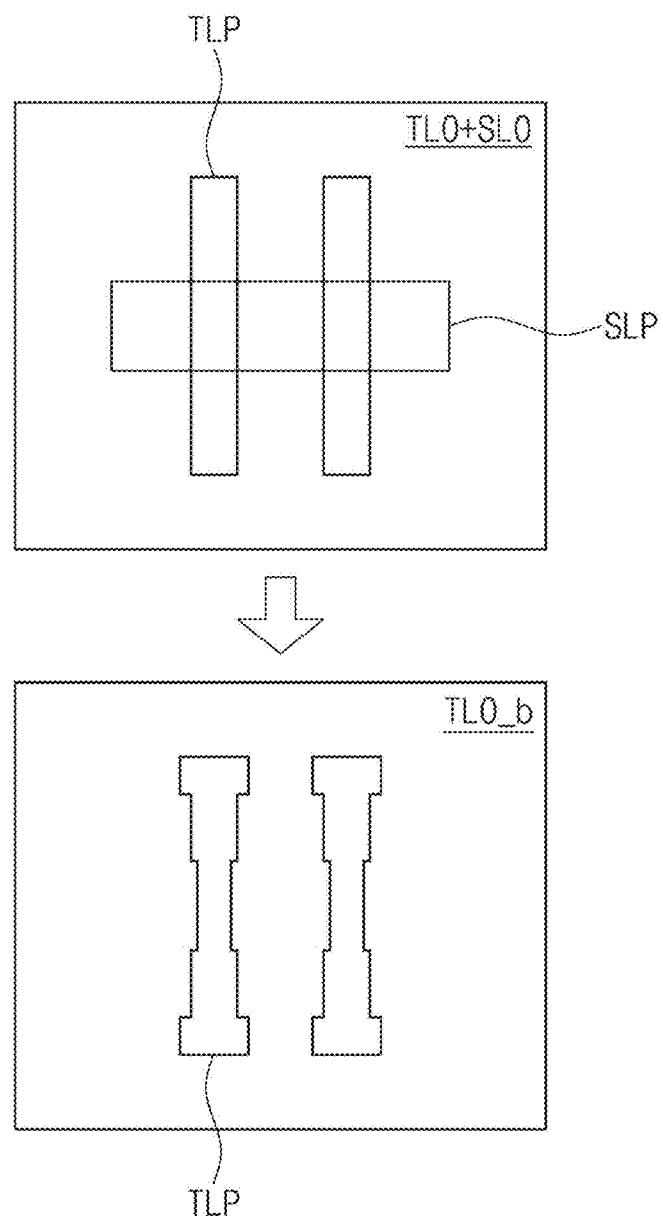
FIG. 18 is a plan view illustrating a layout changed using an OPC modeling result of FIG. 17.

FIG. 18 is a plan view illustrating a layout changed using an OPC modeling result of FIG. 17. The operation S32 of changing (or biasing) the designed layout using the results of the OPC modeling process will be described in more detail with reference to FIGS. 11 and 18.

The optical proximity correction (OPC) process may be performed (e.g., by processing circuitry, such as the CPU 10) on the target layout patterns TLP on the basis of the final model signal FMS of FIG. 17 corresponding to the result of the OPC modeling process. In detail, the designed target layout TLO (e.g., the design layout) may be changed (or biased) using the OPC modeling and its results described above with reference to FIGS. 12 to 17, thereby generating a changed layout TLO_b. In other words, the layout TLO+SLO described above with reference to FIG. 14 may be input into the OPC model and a simulation may be performed using the OPC model, and thus the shapes of the target layout patterns TLP may be changed or biased according to the OPC process.

The optical proximity correction (OPC) process according to some example embodiments may consider the topography effect of the sub-layer SL described above. For example, referring to the changed layout TLO_b of FIG. 18, a width of the target layout pattern TLP located on the sub-layout pattern SLP may be reduced. Referring to the final model signal FMS of FIG. 17 corresponding to the result of the OPC modeling process, it is predicted that a width of the pattern increases on the sub-layer SL (see FIGS. 9 and 10) by the topography effect. Thus, the width of the target layout pattern TLP may be reduced in the changed layout TLO_b. In other words, the OPC model according to some example embodiments may predict (e.g., estimate) the topography effect using the parameter of the transmittance value.

Figure 19:
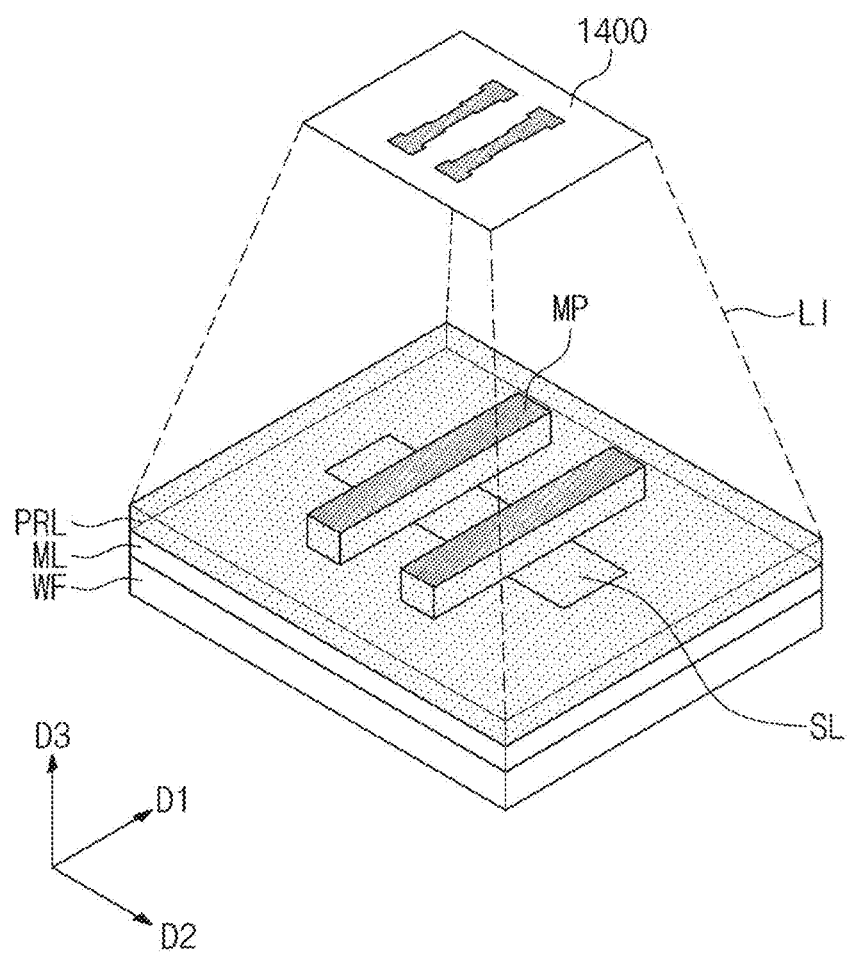
FIG. 19 is a perspective view illustrating a photolithography process according to some example embodiments.

FIG. 19 is a perspective view illustrating a photolithography process according to some example embodiments. Referring to FIGS. 2, 3 and 19, the photomask 1400 may be generated or manufactured using the changed layout TLO_b of FIG. 18 obtained through the OPC modeling process (S40). A photoresist layer PRL may be formed on the planar pattern structure ML and SL disposed on the substrate WF. An exposure process LI using the photomask 1400 may be performed on the photoresist layer PRL. Even though the topography effect is caused by the planar pattern structure ML and SL, photoresist patterns MP may be formed to have desired shapes (e.g., bar shapes having substantially uniform widths and extending in the first direction D1).

Figure 20:
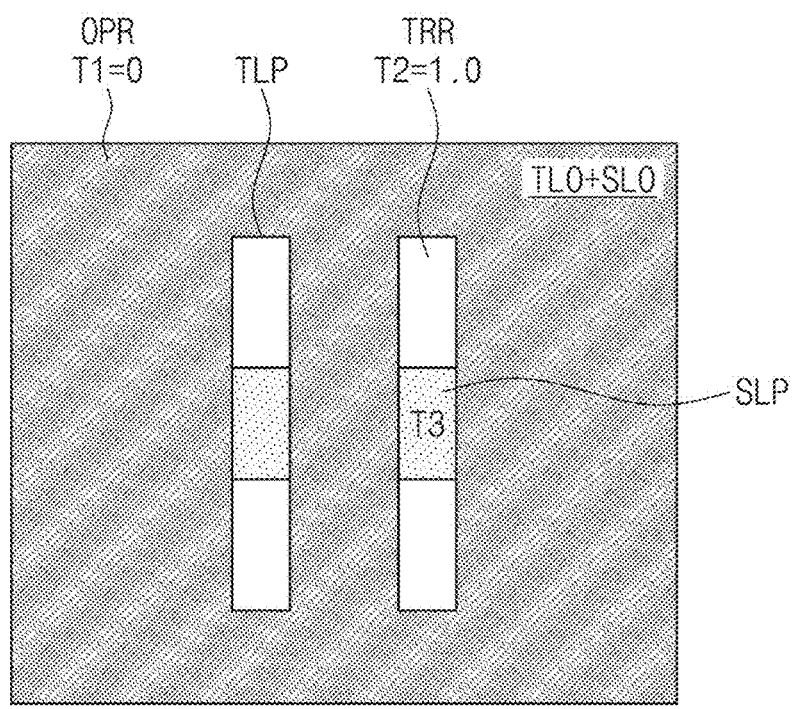
FIG. 20 is a plan view illustrating an operation of setting transmittance values in the layout of FIG. 14.
Figure 21A:
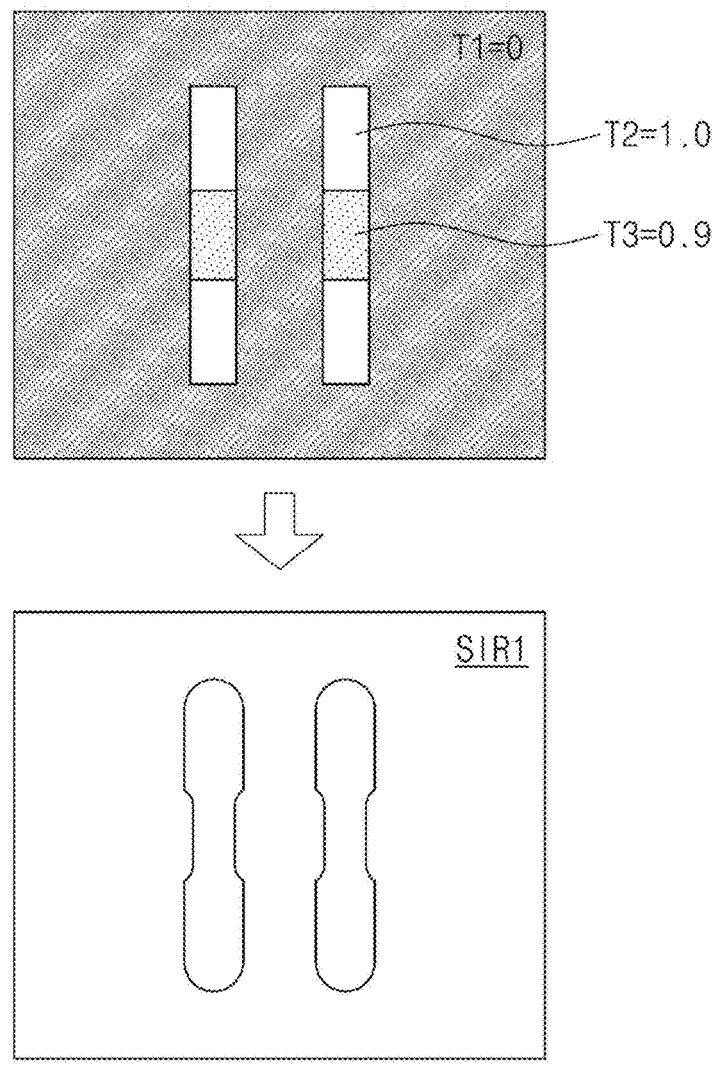
FIG. 21A is a plan view illustrating a first simulation result of a layout of FIG. 20.
Figure 21B:
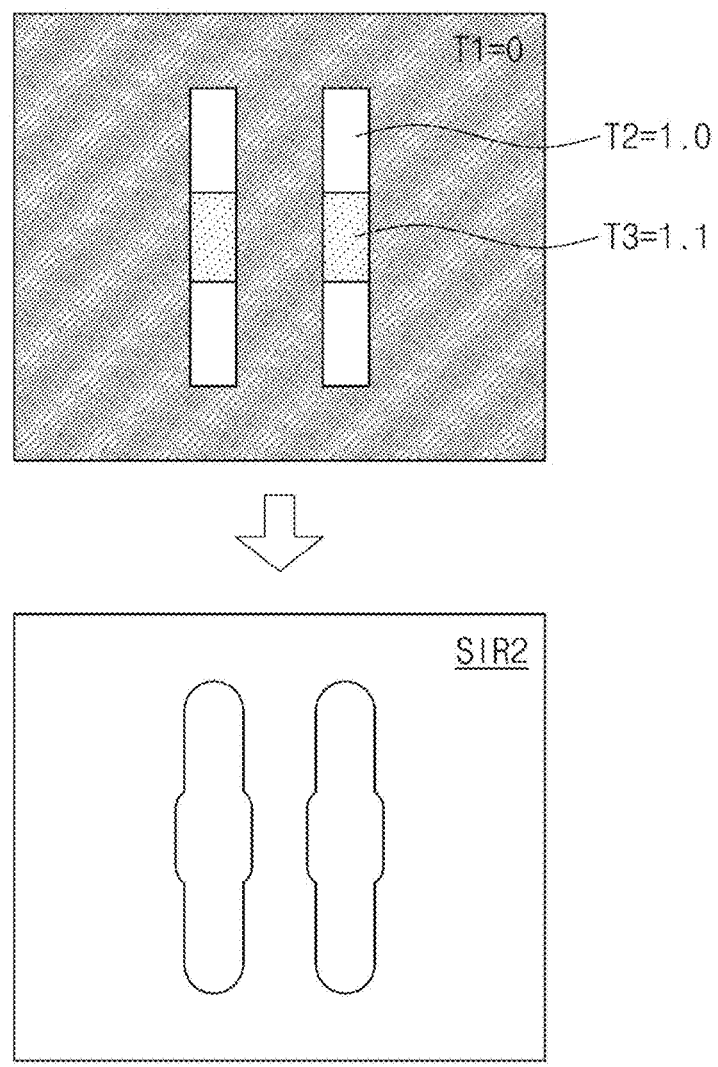
FIG. 21B is a plan view illustrating a second simulation result of the layout of FIG. 20.

Unlike the above example, a photolithography process according to some example embodiments may use a negative photoresist. FIG. 20 is a plan view illustrating an operation of setting transmittance values in the layout of FIG. 14. FIG. 21A is a plan view illustrating a first simulation result of a layout of FIG. 20. FIG. 21B is a plan view illustrating a second simulation result of the layout of FIG. 20.

Referring to FIGS. 12 and 20, transmittance values of the layout TLO+SLO may be set (e.g., by processing circuitry, such as the CPU 10). The target layout TLO may include a transparent region TRR and an opaque region OPR. The target layout patterns TLP defining the photoresist patterns MP may be the transparent regions TRR. A remaining region of the target layout TLO except the target layout patterns TLP may be the opaque region OPR.

The opaque region OPR may have a first transmittance value T1, and the first transmittance value T1 may be set to 0. The transparent region TRR may have a second transmittance value T2, and the second transmittance value T2 may be set to 1.0.

A transmittance value of the sub-layout pattern SLP may be selected (e.g., by processing circuitry, such as the CPU 10) (S312). A region of the sub-layout pattern SLP, which overlaps with the transparent region TRR, may have a third transmittance value T3. Other regions of the sub-layout pattern SLP, which overlap with the opaque region OPR, may be excluded from consideration. In other words, the other regions of the sub-layout pattern SLP, which overlap with the opaque region OPR, may have the first transmittance value T1.

The third transmittance value T3 may be selected to be greater or less than 1.0. For example, the third transmittance value T3 may be selected in a range of 0.1 to 2.0. Hereinafter, a method of selecting the third transmittance value T3 will be described as an example.

Referring to FIG. 21A, the third transmittance value T3 may be set to 0.9 slightly less than 1.0. The OPC model may simulate (e.g., processing circuitry, such as the CPU 10, may simulate using the OPC model) a shape of a pattern to be formed on a substrate, based on the layout and the transmittance values shown in FIG. 21A. An example image of the result is shown as a first simulation result SIR1.

Referring to FIG. 21B, the third transmittance value T3 may be set to 1.1 slightly greater than 1.0. The OPC model may simulate (e.g., processing circuitry, such as the CPU 10, may simulate using the OPC model) a shape of a pattern to be formed on a substrate, based on the layout and the transmittance values shown in FIG. 21B. An example image of the result is shown as a second simulation result SIR2.

A more appropriate result may be selected by comparing the first and second simulation results SIR1 and SIR2 with each other. For example, when the second simulation result SIR2 of FIG. 21B is determined as an appropriate result, the third transmittance value T3 of the sub-layout pattern SLP may be selected as 1.1. The first transmittance value (T1=0), the second transmittance value (T2=1.0) and the third transmittance value (T3=1.1) may be set as transmittance parameters of the OPC model. Thereafter, as described above with reference to FIGS. 12 and 17, a final model signal FMS may be generated (e.g., processing circuitry, such as the CPU 10) using the OPC model in which the transmittance parameters are set (S313).

Figure 22:
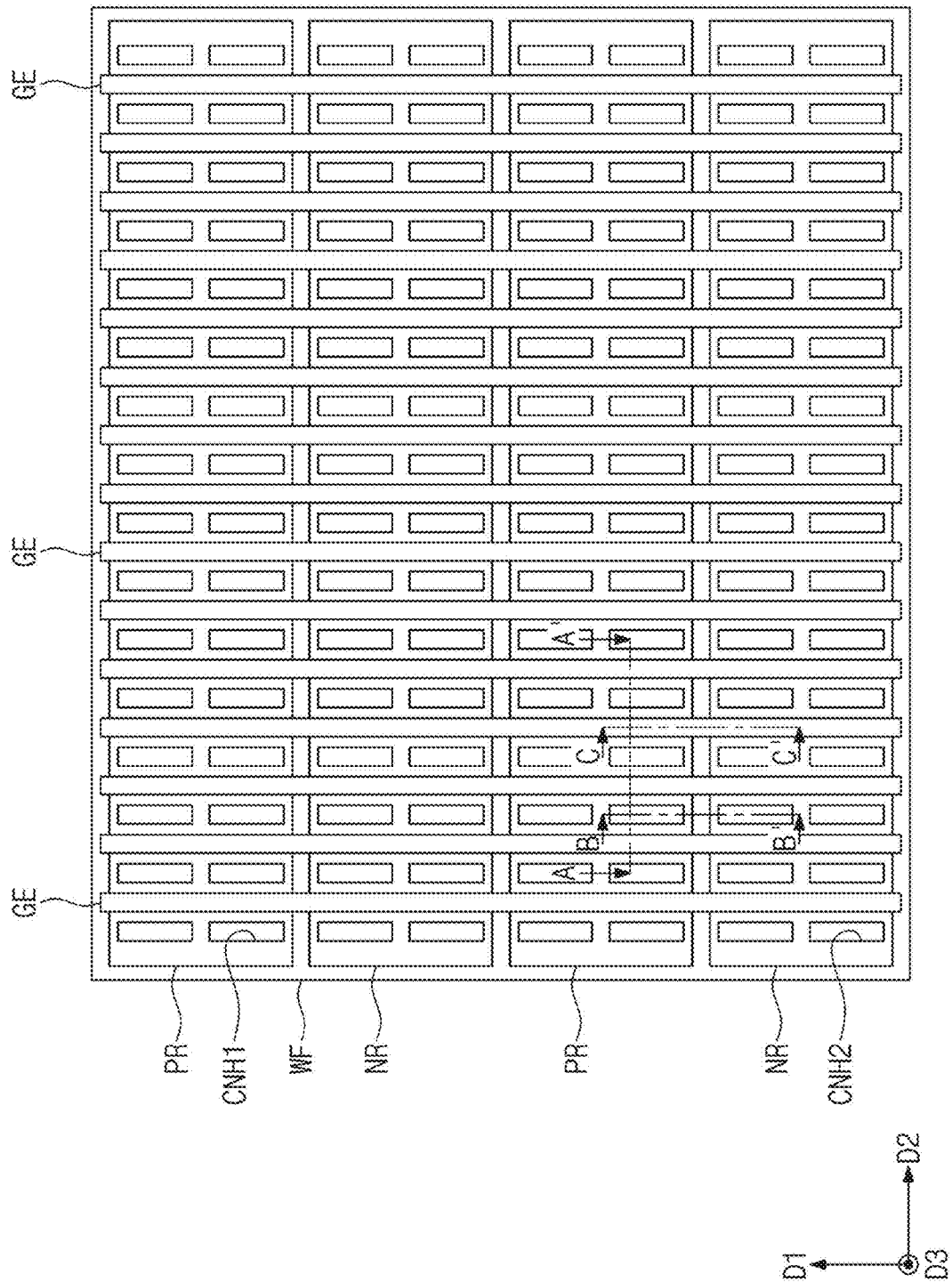
FIGS. 22, 24 and 26 are plan views illustrating a method for manufacturing a semiconductor device, according to some example embodiments.
Figure 23A:
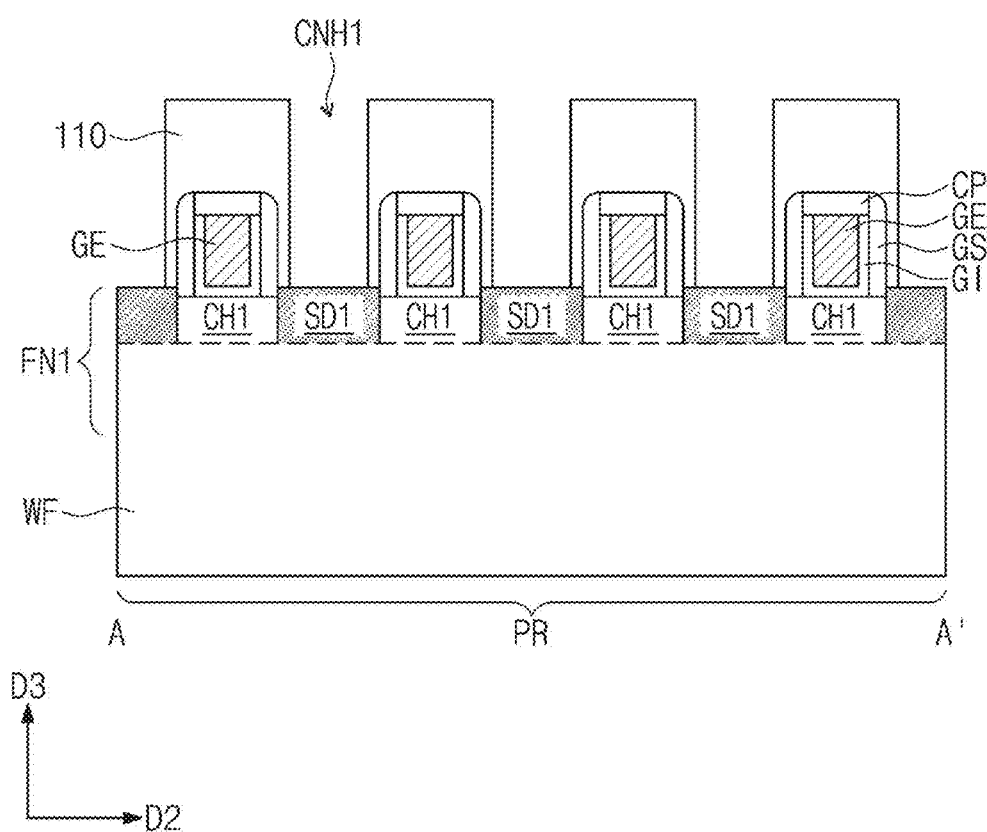
FIGS. 23A, 25A and 27A are cross-sectional views taken along lines A-A' of FIGS. 22, 24 and 26, respectively.
Figure 23B:
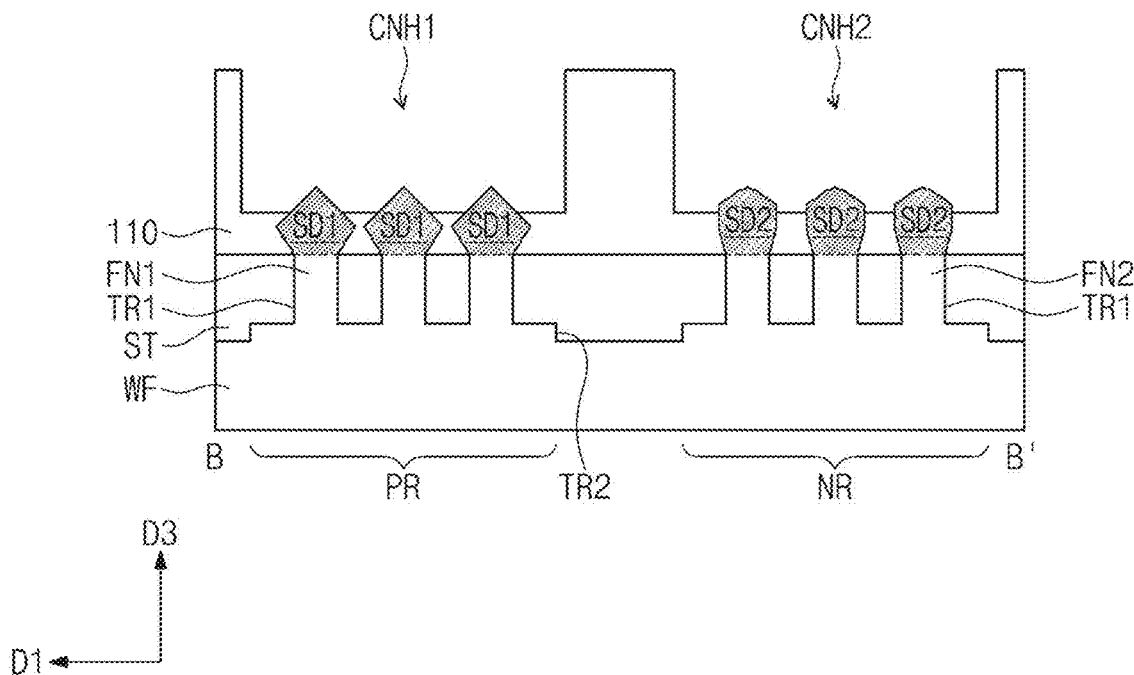
FIGS. 23B, 25B and 27B are cross-sectional views taken along lines B-B' of FIGS. 22, 24 and 26, respectively.
Figure 23C:
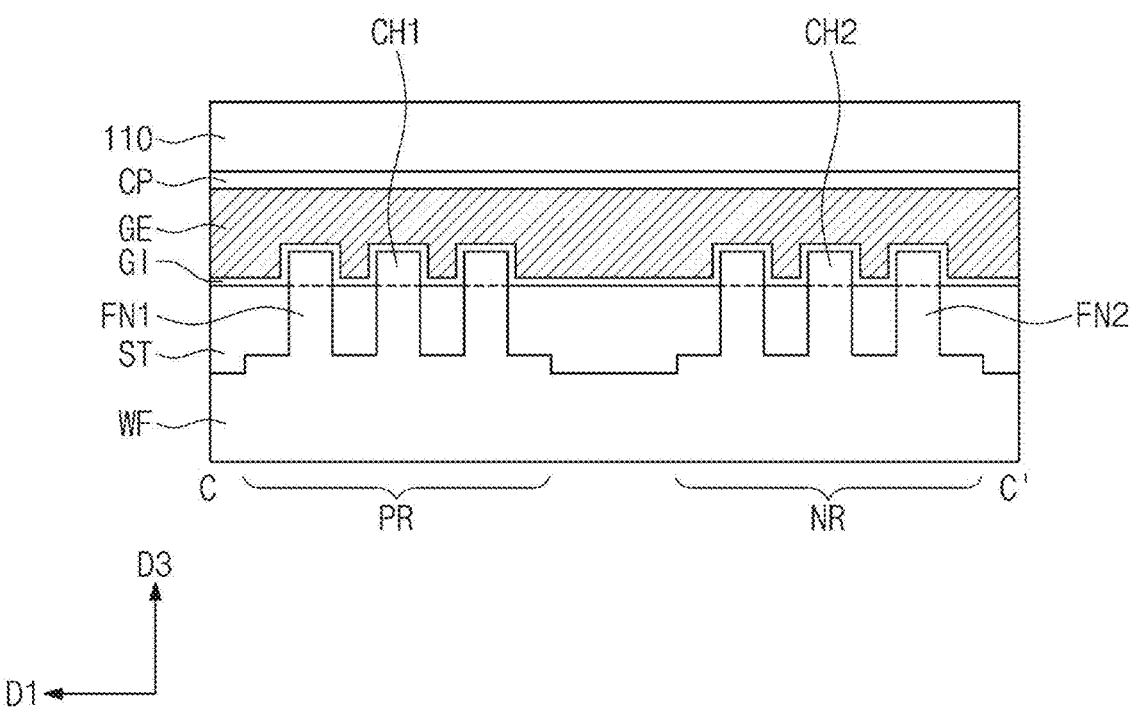
FIGS. 23C, 25C and 27C are cross-sectional views taken along lines C-C' of FIGS. 22, 24 and 26, respectively.
Figure 24:
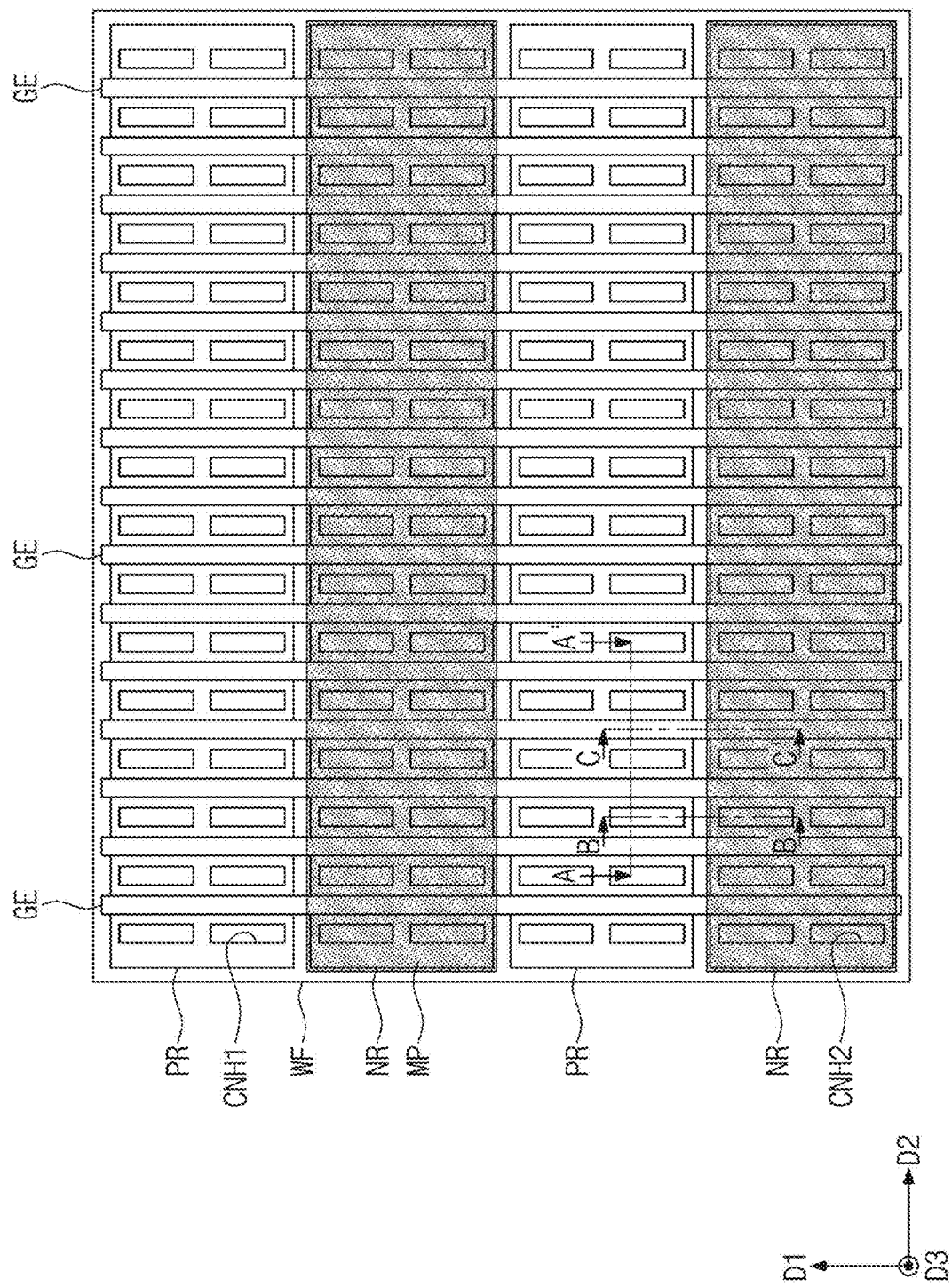
Figure 25A:
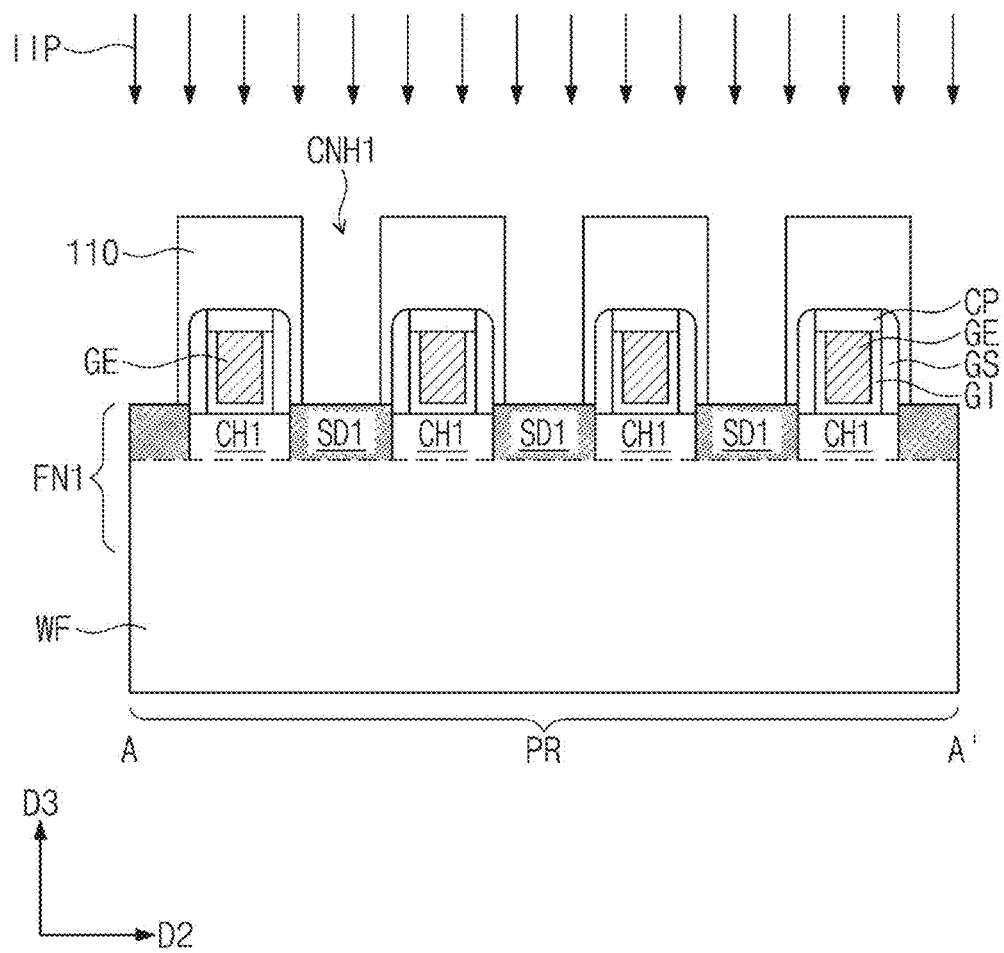
Figure 25B:
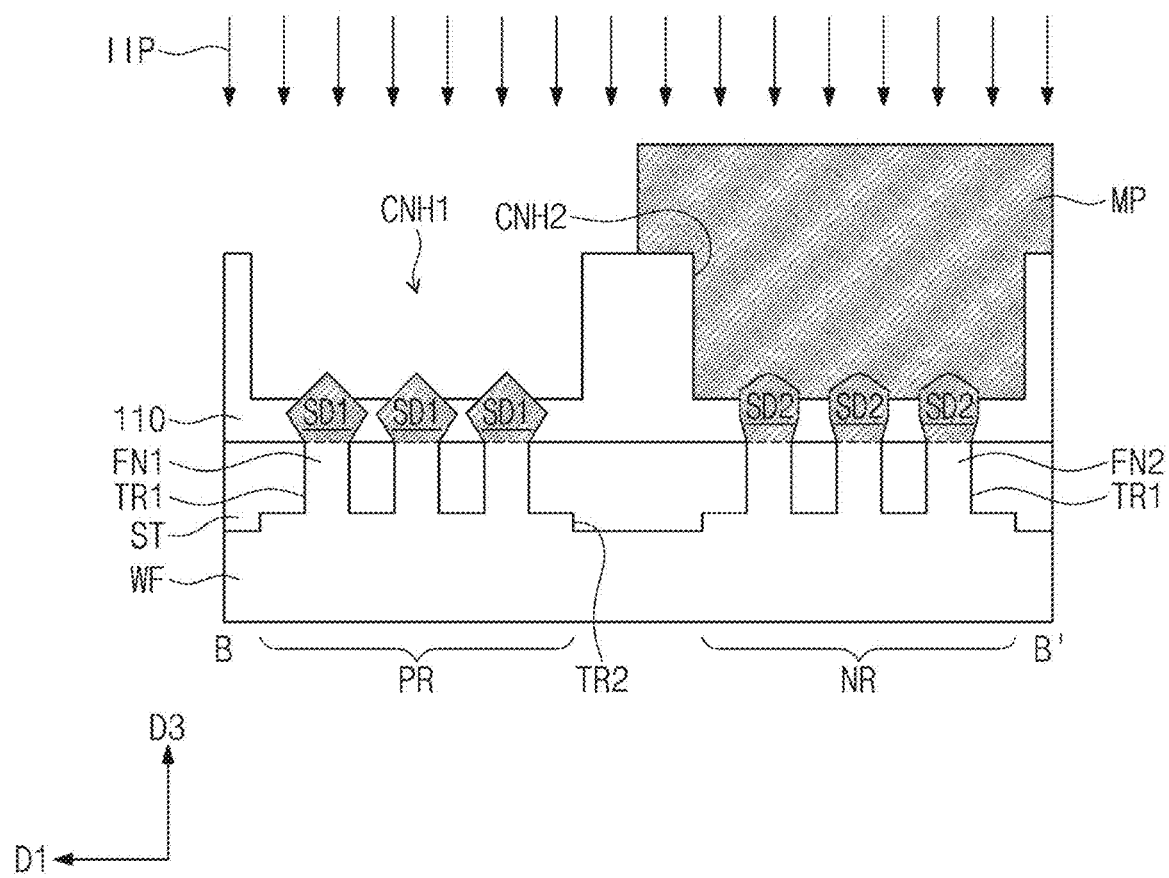
Figure 25C:
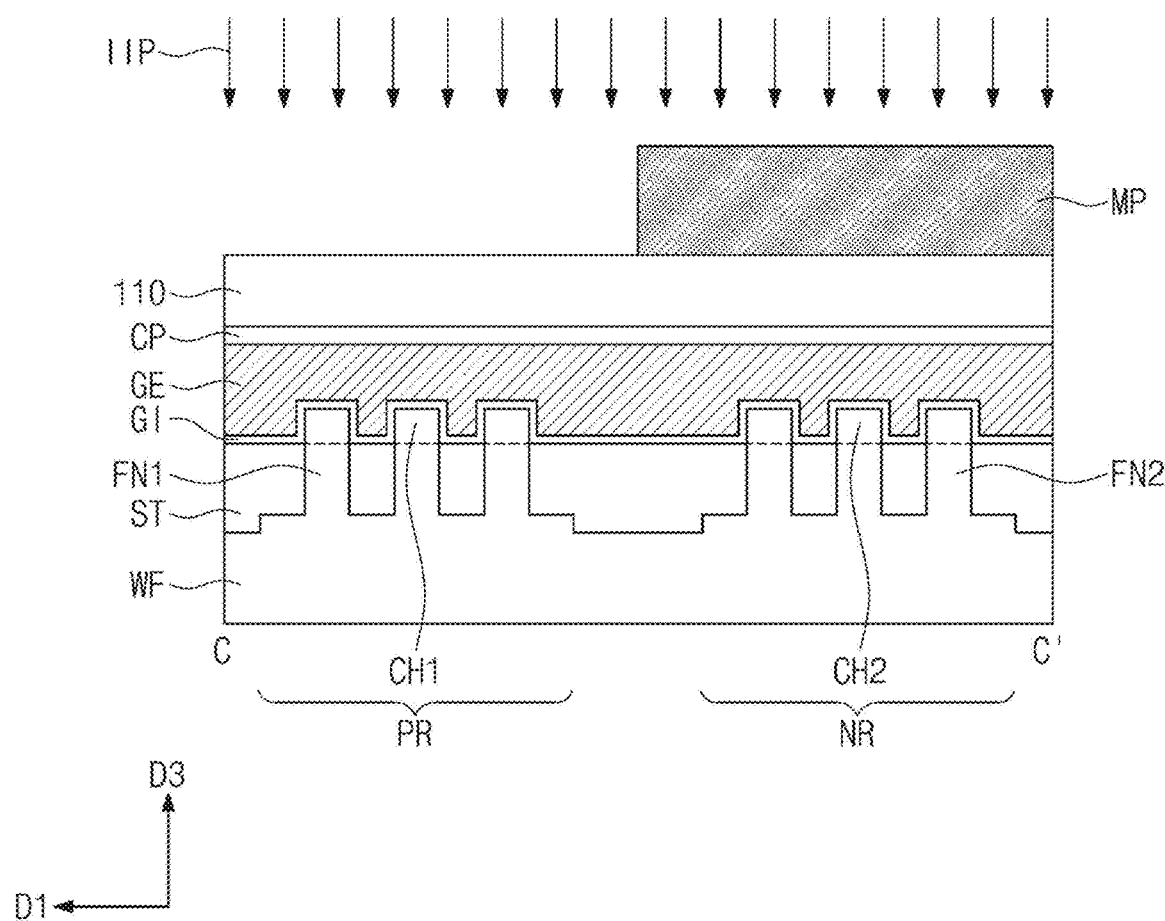
Figure 26:
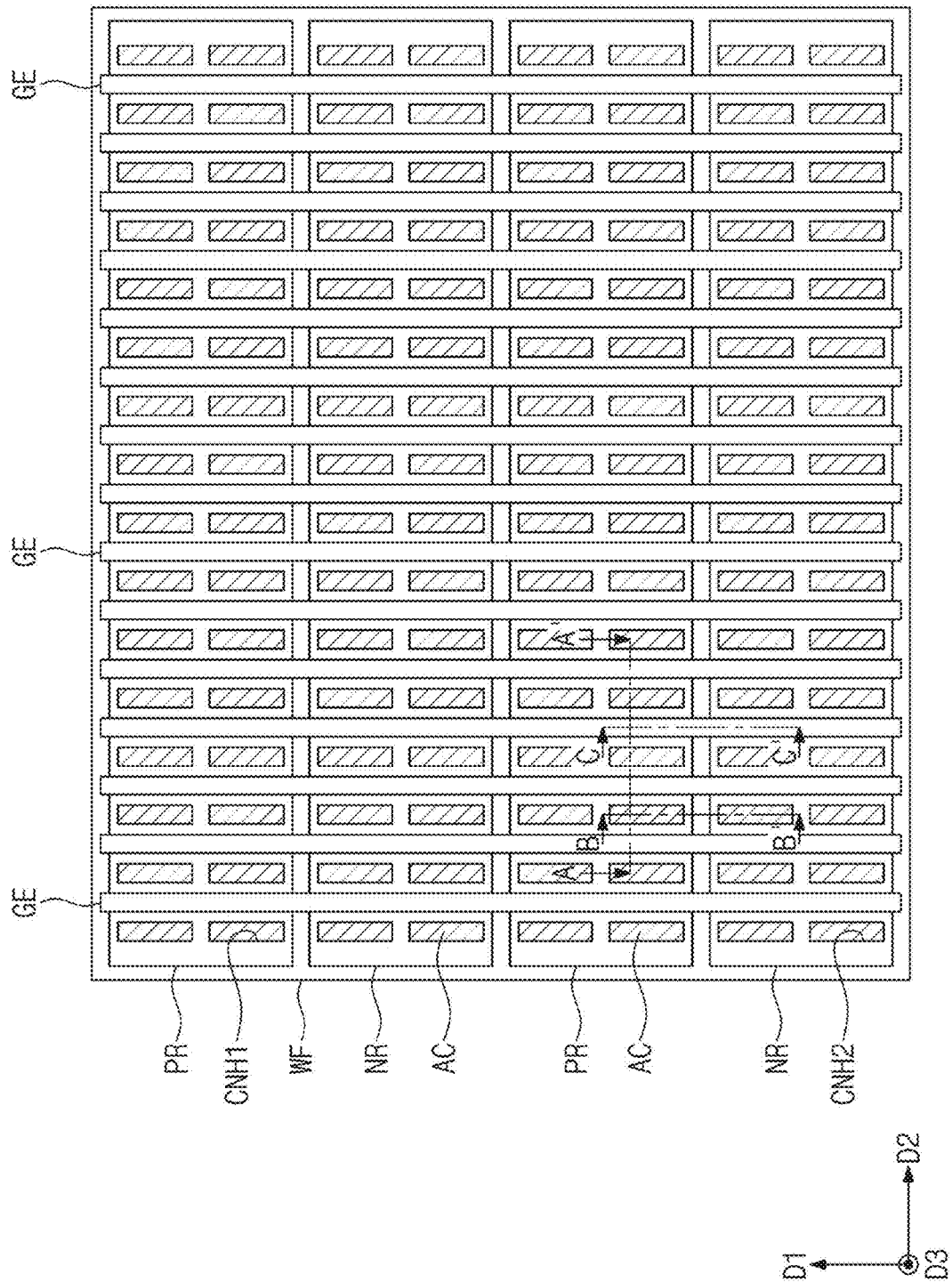
Figure 27A:
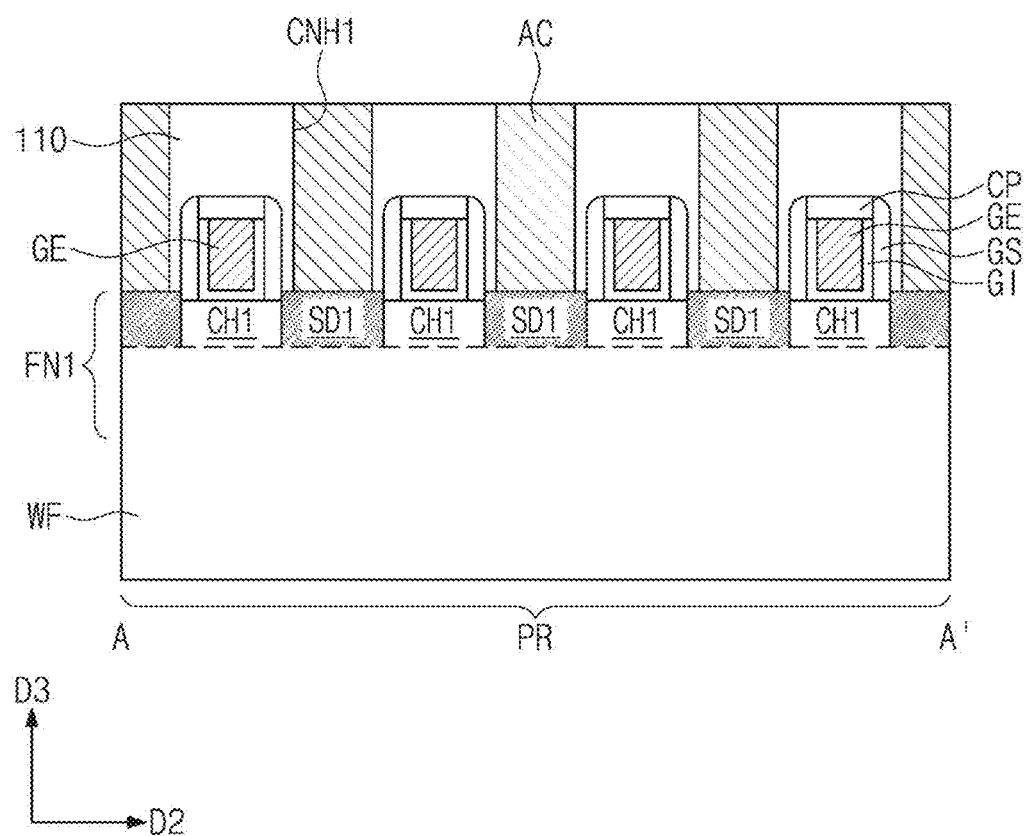
Figure 27B:
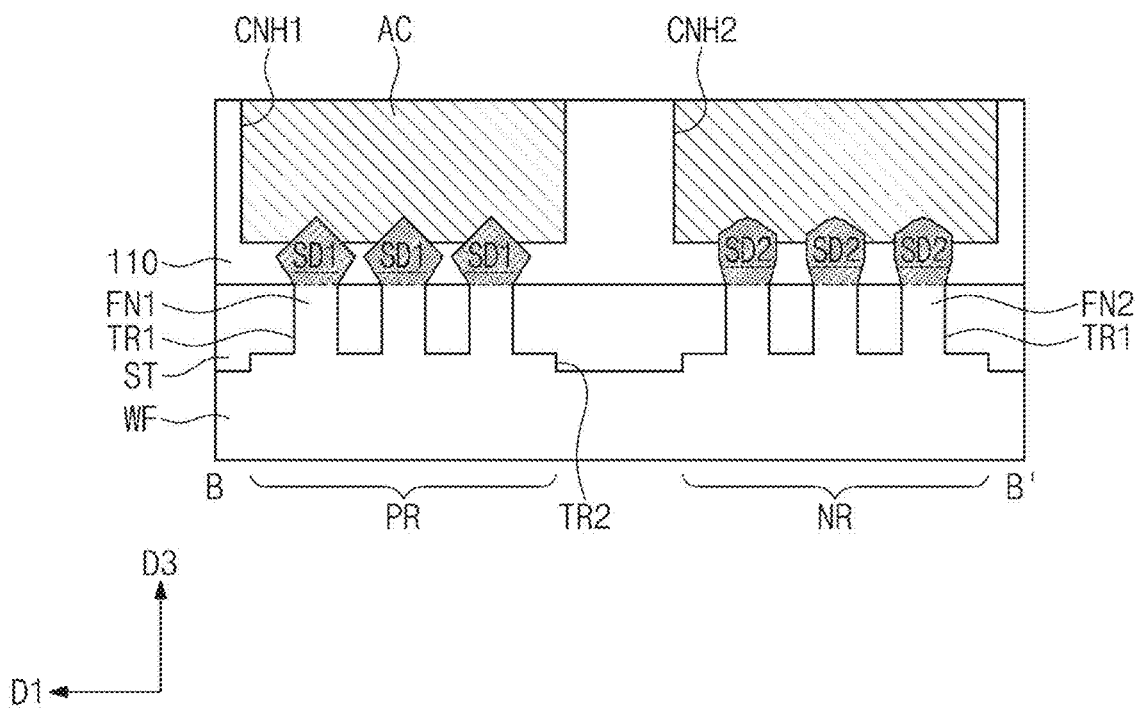
Figure 27C:
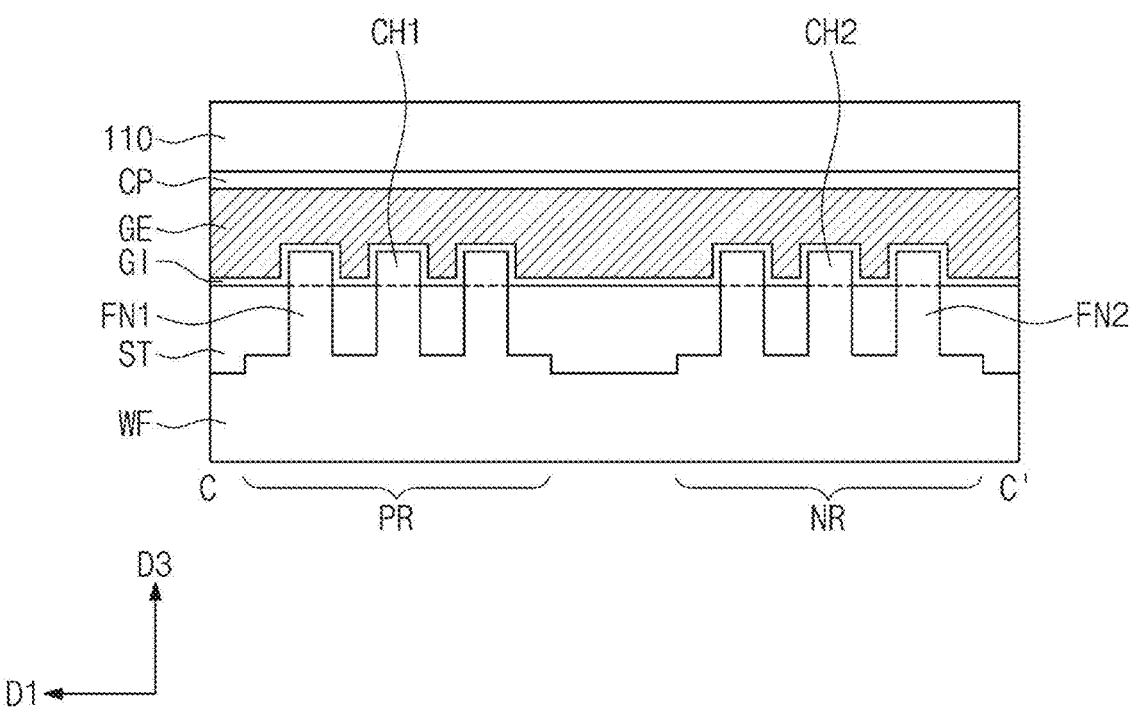
Figure 28:
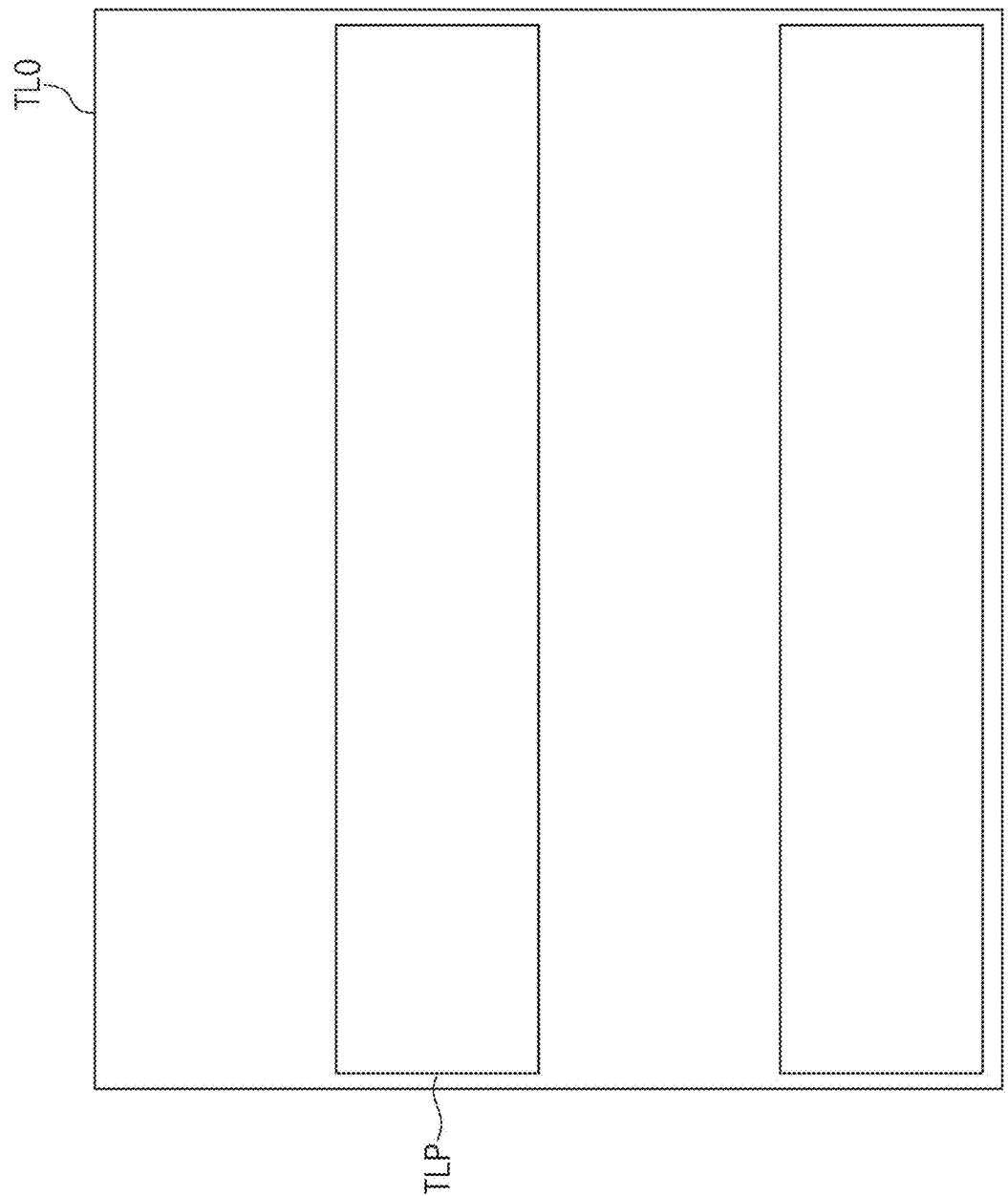
FIG. 28 is a plan view illustrating a target layout according to some example embodiments.
Figure 29:
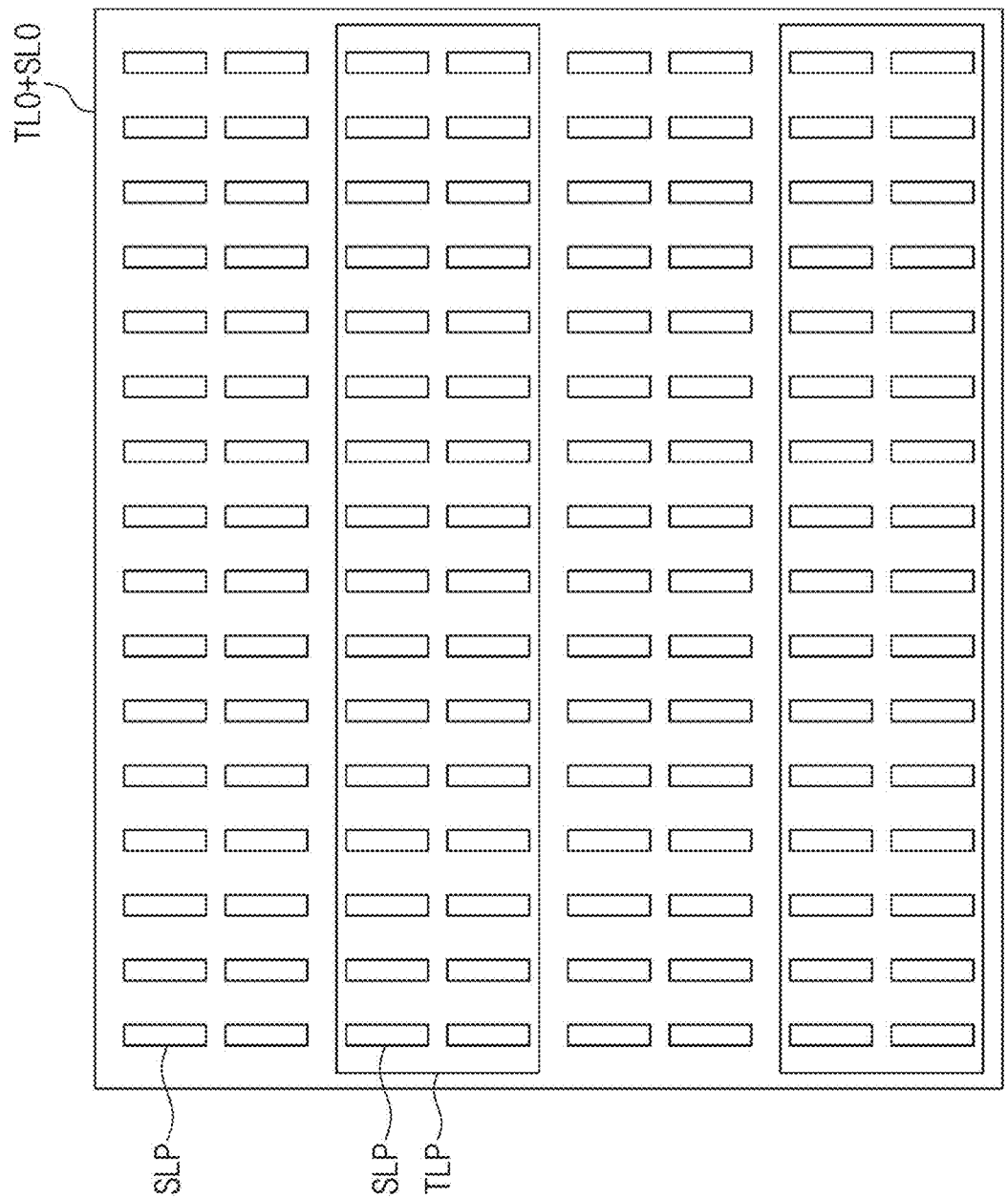
FIG. 29 is a plan view illustrating an operation of inputting a sub-layout into the target layout of FIG. 28.
Figure 30:
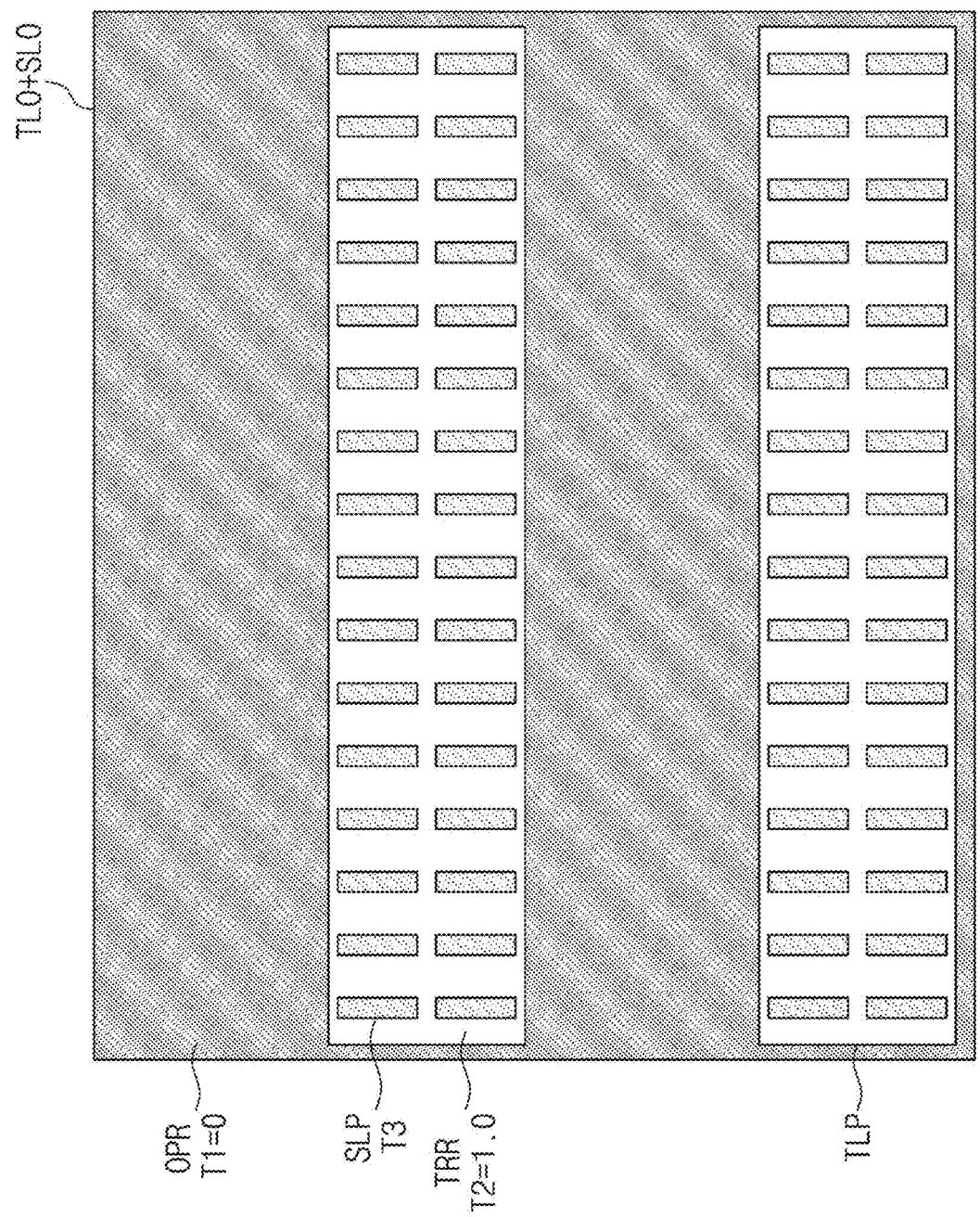
FIG. 30 is a plan view illustrating an operation of setting transmittance values in a layout of FIG. 29.

FIGS. 22, 24 and 26 are plan views illustrating a method for manufacturing a semiconductor device, according to some example embodiments. FIGS. 23A, 25A and 27A are cross-sectional views taken along lines A-A' of FIGS. 22, 24 and 26, respectively, FIGS. 23B, 25B and 27B are cross-sectional views taken along lines B-B' of FIGS. 22, 24 and 26, respectively, and FIGS. 23C, 25C and 27C are cross-sectional views taken along lines C-C' of FIGS. 22, 24 and 26, respectively. FIG. 28 is a plan view illustrating a target layout according to some example embodiments. FIG. 29 is a plan view illustrating an operation of inputting a sub-layout into the target layout of FIG. 28. FIG. 30 is a plan view illustrating an operation of setting transmittance values in a layout of FIG. 29. FIG. 31 is a plan view illustrating a layout changed using an OPC modeling result.

Referring to FIGS. 22, 23A, 23B and 23C, a substrate WF may be provided. For example, the substrate WF may be a silicon substrate, a germanium substrate, and/or a silicon-on-insulator (SOI) substrate. An upper portion of the substrate WF may be patterned to form first trenches TR1 defining first and second active patterns FN1 and FN2. The first and second active patterns FN1 and FN2 may extend in parallel to each other in a second direction D2. Each of the first and second active patterns FN1 and FN2 may have a fin-shape protruding from a top surface of the substrate WF.

An upper portion of the substrate WF may be patterned to form second trenches TR2 defining first regions PR and second regions NR. The second trenches TR2 may be formed to be deeper than the first trenches TR1.

Each of the first regions PR may be a p-channel metal-oxide semiconductor field-effect transistor (PMOSFET) region. Each of the second regions NR may be an p-channel metal-oxide semiconductor field-effect transistor (NMOSFET) region. The first active patterns FN1 may be provided on the first regions PR. The second active patterns FN2 may be provided on the second regions NR. The first and second regions PR and NR may extend in the second direction D2. The first and second regions PR and NR may be alternately arranged in a first direction D1.

A device isolation layer ST may be formed in the first and second trenches TR1 and TR2. The device isolation layer ST may be formed using silicon oxide. An upper portion of each of the first and second active patterns FN1 and FN2 may protrude upward from a top surface of the device isolation layer ST.

Gate electrodes GE may be formed on the substrate WF. The gate electrodes GE may extend in the first direction D1 to intersect the first and second active patterns FN1 and FN2. Gate dielectric layers GI may be formed under the gate electrodes GE. Gate spacers GS may be formed on both sidewalls of each of the gate electrodes GE. Gate capping layers CP may be formed on the gate electrodes GE.

In detail, the formation of the gate electrodes GE may include forming sacrificial patterns intersecting the first and second active patterns FN1 and FN2, forming the gate spacers GS on both sidewalls of each of the sacrificial patterns, and/or replacing the sacrificial patterns with the gate electrodes GE.

For example, the gate electrodes GE may include at least one of a conductive metal nitride (e.g., titanium nitride and/or tantalum nitride) and/or a metal material (e.g., titanium, tantalum, tungsten, copper, and/or aluminum). The gate dielectric layers GI may include a high-k dielectric material of which a dielectric constant is higher than that of silicon oxide. The gate spacers GS may include at least one of SiCN, SiCON, or SiN. The gate capping layers CP may include at least one of SiON, SiCN, SiCON, or SiN.

First source/drain regions SD1 may be formed in upper portions of the first active patterns FN1. A pair of the first source/drain regions SD1 may be formed at both sides of each of the gate electrodes GE, respectively. Second source/drain regions SD2 may be formed in upper portions of the second active patterns FN2. A pair of the second source/drain regions SD2 may be formed at both sides of each of the gate electrodes GE, respectively. According to some example embodiments, first source/drain regions SD1 and second source/drain regions SD2 each refer to a structure or region that may be used as a source or a drain, as would be understood by a person of ordinary skill in the art.

In detail, the first and second source/drain regions SD1 and SD2 may include epitaxial patterns formed by a selective epitaxial growth (SEG) process. In some example embodiments, the upper portions of the first and second active patterns FN1 and FN2 exposed between the gate electrodes GE may be recessed, and then, the SEG process may be performed on the recessed regions of the first and second active patterns FN1 and FN2 to form the epitaxial patterns.

An interlayer insulating layer 110 may be formed on an entire top surface or a portion of the top surface of the substrate WF. The interlayer insulating layer 110 may be formed of a silicon oxide layer and/or a silicon oxynitride layer. The interlayer insulating layer 110 may be patterned to form first contact holes CNH1 exposing the first source/drain regions SD1. The interlayer insulating layer 110 may be patterned to form second contact holes CNH2 exposing the second source/drain regions SD2.

Referring to FIGS. 24, 25A, 25B and 25C, photoresist patterns MP may be formed to cover the second regions NR. For example, the formation of the photoresist patterns MP may include a photolithography process using a negative photoresist.

The photoresist patterns MP may expose the first regions PR. In other words, the photoresist patterns MP may cover the second contact holes CNH2. The photoresist patterns MP may not cover the first contact holes CNH1. Thus, the first source/drain regions SD1 may not be covered by the photoresist patterns MP but may be exposed.

An ion implantation process IIP may be performed on an entire top surface of the substrate WF to dope the exposed first source/drain regions SD1 with dopants. The first source/drain regions SD1 may be doped with the dopants and thus may have a P-type conductivity type.

Hereinafter, a method of forming the photoresist patterns MP will be described in more detail.

Referring to FIGS. 12 and 28, a target layout TLO including target layout patterns TLP may be prepared (S310). The target layout TLO of FIG. 28 is a layout of the photoresist patterns MP described above with reference to FIGS. 24, 25A, 25B and 25C. In other words, the target layout patterns TLP may correspond to the photoresist patterns MP.

Referring to FIGS. 12 and 29, a sub-layout SLO may be input into the target layout TLO (S311). The sub-layout SLO is a layout of the first and second contact holes CNH1 and CNH2 described above with reference to FIGS. 22, 23A, 23B and 23C. In other words, sub-layout patterns SLP of the sub-layout SLO may correspond to (e.g., define) the first and second contact holes CNH1 and CNH2.

Referring to FIGS. 12 and 30, transmittance values of the layout TLO+SLO may be set. Since the negative photoresist is used in the present example, the target layout patterns TLP defining the photoresist patterns MP may be transparent regions TRR, and a remaining region of the target layout TLO except the target layout patterns TLP may be an opaque region OPR. The opaque region OPR may have a first transmittance value T1, and the first transmittance value T1 may be set to 0. The transparent region TRR may have a second transmittance value T2, and the second transmittance value T2 may be set to 1.0.

A transmittance value of the sub-layout patterns SLP may be selected (S312). Each of the sub-layout patterns SLP overlapping with the transparent regions TRR may have a third transmittance value T3. The sub-layout patterns SLP overlapping with the opaque region OPR may be excluded from consideration.

The third transmittance value T3 may be selected to be greater or less than 1.0. A method of selecting the third transmittance value T3 may be the same or substantially the same as described above with reference to FIGS. 21A and 21B.

When the third transmittance value T3 is selected, the first transmittance value T1, the second transmittance value T2 and the third transmittance value T3 may be set as transmittance parameters of the OPC model. Thereafter, a final model signal may be generated using the OPC model in which the transmittance parameters are set (S313).

Referring to FIGS. 11 and 31, the target layout TLO may be changed (or biased) using the results of the OPC modeling process, thereby forming a changed layout TLO_b. The layout TLO+SLO described above with reference to FIG. 29 may be input into the OPC model and a simulation may be performed using the OPC model, and thus the shapes of the target layout patterns TLP may be changed and/or biased. For example, widths of the target layout patterns TLP may be widened in the changed layout TLO_b.

Thereafter, a photomask may be generated and/or manufactured using the changed layout TLO_b (S40 of FIG. 2). In the some example embodiments, a planar pattern structure on the substrate WF may include the interlayer insulating layer 110 and an air layer (e.g., air filling the first and second contact holes CNH1 and CNH2). A photoresist layer may be formed on the planar pattern structure disposed on the substrate WF. An exposure process using the photomask and a development process may be performed on the photoresist layer to form the photoresist patterns MP described above with reference to FIGS. 24, 25A, 25B and 25C.

According to some example embodiments, even though a topography effect is caused by a silicon oxide layer (e.g., the interlayer insulating layer 110) and the air layer (e.g., the first and second contact holes CNH1 and CNH2), the photoresist patterns MP may be formed to have desired shapes (e.g., mask shapes having substantially uniform widths and extending in the second direction D2).

Even though not shown in the drawings, after performing the ion implantation process IIP on the first source/drain regions SD1, an ion implantation process may be selectively performed on the second source/drain regions SD2. Since the second source/drain regions SD2 are doped with dopants, the second source/drain regions SD2 may have an N-type conductivity type. A method of selectively opening the second source/drain regions SD2 and performing the ion implantation process may be the same or substantially the same as the method described above with reference to FIGS. 24 to 31.

Referring to FIGS. 26, 27A, 27B and 27C, active contacts AC may be formed in the first and second contact holes CNH1 and CNH2. The active contacts AC may be formed on the first and second source/drain regions SD1 and SD2. For example, the active contacts AC may include at least one selected from metal materials such as aluminum, copper, tungsten, molybdenum, and/or cobalt. Thereafter, even though not shown in the drawings, a plurality of metal interconnection layers may be formed on the interlayer insulating layer 110.

The OPC modeling method according to some example embodiments predict the topography effect by one optic model using the transmittance value of the sub-layout pattern. In other words, according to some example embodiments, the OPC modeling method may predict the topography effect without using a plurality of optic models, and thus the OPC modeling method may be performed more quickly and without a lot of calculations.

While the some example embodiments have been described, it will be apparent to those skilled in the art that various changes and modifications may be made without departing from the spirits and scope thereof. Therefore, it should be understood that some example embodiments are not limiting, but illustrative. Thus, the scope of some example embodiments are to be determined by the broadest permissible interpretation of the following claims and their equivalents, and shall not be restricted or limited by the foregoing description.

What is claimed is:

1. A method for manufacturing a semiconductor device, the method comprising:
    performing an optical proximity correction (OPC) process on a designed layout based on a final model signal obtained according to an OPC modeling process to generate a corrected layout, the OPC modeling process including,
        selecting a transmittance value of a sub-layout pattern of a sub-layout included in a target layout, the transmittance value being a parameter of an OPC model and representing an intensity of light that transmits through a photomask, and
        generating a final model signal based on the transmittance value of the sub-layout pattern; and
    forming a photoresist pattern on a substrate using the photomask generated based on the corrected layout.

2. The method of claim 1, wherein the target layout is a layout of the photoresist pattern.

3. The method of claim 1, wherein
    the forming the photoresist pattern forms the photoresist pattern on a planar pattern structure on the substrate;
    the planar pattern structure comprises a main layer and a sub-layer, the sub-layer including a different material from that of the main layer; and
    the sub-layout is a layout of the sub-layer.

4. The method of claim 3, wherein the forming the photoresist pattern forms the photoresist pattern on at least a portion of the main layer and at least a portion of the sub-layer.

5. The method of claim 3, wherein the generating the final model signal generates the final model signal based on a topography effect caused by the planar pattern structure.

6. The method of claim 3, wherein the main layer is a silicon oxide layer and the sub-layer is an air layer.

7. The method of claim 1, wherein the OPC modeling process further comprises:
    setting a transmittance value of a transparent region of the target layout to 1.0; and
    setting a transmittance value of an opaque region of the target layout to 0,
    wherein the transmittance value of the sub-layout pattern is selected from among transmittance values ranging from 0.1 to 2.0.

8. The method of claim 7, wherein the transmittance value of the sub-layout pattern is assigned to a region of the sub-layout pattern overlapping the transparent region.

9. The method of claim 7, wherein the selecting the transmittance value of the sub-layout pattern comprises:
    obtaining a first simulation result by setting the transmittance value of the sub-layout pattern to a value less than 1.0;
    obtaining a second simulation result by setting the transmittance value of the sub-layout pattern to a value greater than 1.0; and
    selecting the transmittance value of the sub-layout pattern based on the first simulation result and the second simulation result.

10. The method of claim 1, further comprising:
    forming a first active pattern on a first region of the substrate and a second active pattern on a second region of the substrate;

forming a first source/drain region in the first active pattern and a second source/drain region in the second active pattern;

forming an interlayer insulating layer on a top surface of the substrate;

forming a first contact hole in the interlayer insulating layer to expose the first source/drain region;

forming a second contact hole in the interlayer insulating layer to expose the second source/drain region; and performing an ion implantation process, wherein the forming the photoresist pattern forms the photoresist pattern on the second region and not the first region, and the performing an ion implantation process causes dopants to be selectively implanted into the first source/drain region and not the second source/drain region based on the photoresist pattern.

11. A method for manufacturing a semiconductor device, the method comprising:

performing an optical proximity correction (OPC) process on a designed layout based on a OPC modeling process to generate a corrected layout, the OPC modeling process including, selecting a transmittance value of a sub-layout pattern to generate a final model signal, the sub-layout pattern defining a sub-layer and being included in a target layout, the target layout defining a photoresist pattern, the final model signal being generated based on a topography effect caused by a planar pattern structure; and forming the photoresist pattern on the planar pattern structure on a substrate by using a photomask generated based on the corrected layout, the planar pattern structure including a main layer and a sub-layer, the sub-layer including a different material from that of the main layer.

12. The method of claim 11, wherein the transmittance value is a parameter of an OPC model and representing an intensity of light that transmits through the photomask.

13. The method of claim 11, wherein the photoresist pattern is formed on at least a portion of the main layer and at least a portion of the sub-layer.

14. The method of claim 11, wherein the OPC modeling process further comprises:

setting a transmittance value of a transparent region of the target layout to 1.0; and setting a transmittance value of an opaque region of the target layout to 0, wherein the transmittance value of the sub-layout pattern is selected from among transmittance values ranging from 0.1 to 2.0.

15. The method of claim 14, wherein the selecting the transmittance value of the sub-layout pattern comprises:

obtaining a first simulation result by setting the transmittance value of the sub-layout pattern to a value less than 1.0;

obtaining a second simulation result by setting the transmittance value of the sub-layout pattern to a value greater than 1.0; and selecting the transmittance value of the sub-layout pattern based on the first simulation result and the second simulation result.

16. A method for manufacturing a semiconductor device, the method comprising:

forming a first active pattern on a first region of a substrate and a second active pattern on a second region of the substrate;

forming a first source/drain region in the first active pattern and a second source/drain region in the second active pattern;

forming an interlayer insulating layer on a top surface of the substrate;

forming a first contact hole in the interlayer insulating layer to expose the first source/drain region;

forming a second contact hole in the interlayer insulating layer to expose the second source/drain region;

forming a photoresist pattern on the second region and not on the first region by performing an optical proximity correction (OPC) process on a target layout defining the photoresist pattern, the OPC process being performed based on a final model signal obtained according to an OPC modeling process, the OPC modeling process including, selecting a transmittance value of a sub-layout pattern to generate a final model signal, the sub-layout pattern defining the first contact hole and the second contact hole, the sub-layout pattern being included in the target layout; and doping the first source/drain region with dopants through the first contact hole by using the photoresist pattern as a mask.

17. The method of claim 16, wherein the transmittance value is a parameter of an OPC model representing an intensity of light that transmits through a photomask.

18. The method of claim 16, wherein the forming a photoresist pattern uses a negative photoresist; and the selecting a transmittance value of a sub-layout pattern selects a transmittance value of the second contact hole and not a transmittance value of the first contact hole.

19. The method of claim 16, wherein the OPC modeling process further comprises:

setting a transmittance value of a transparent region of the target layout to 1.0; and setting a transmittance value of an opaque region of the target layout to 0, wherein the transmittance value of the sub-layout pattern is selected from among transmittance values ranging from 0.1 to 2.0.

20. The method of claim 19, wherein the selecting a transmittance value of a sub-layout pattern comprises:

obtaining a first simulation result by setting the transmittance value of the sub-layout pattern to a value less than 1.0;

obtaining a second simulation result by setting the transmittance value of the sub-layout pattern to a value greater than 1.0; and selecting the transmittance value of the sub-layout pattern based on the first simulation result and the second simulation result.

* * * * *